(12) United States Patent
Sugiyama

(10) Patent No.: US 11,006,055 B2
(45) Date of Patent: May 11, 2021

(54) IMAGING DEVICE AND METHOD FOR DRIVING THE SAME, AND IMAGING APPARATUS

(71) Applicant: Sony Corporation, Tokyo (JP)

(72) Inventor: Toshinobu Sugiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 57 days.

(21) Appl. No.: 16/061,813

(22) PCT Filed: Dec. 8, 2016

(86) PCT No.: PCT/JP2016/086465
§ 371 (c)(1),
(2) Date: Jun. 13, 2018

(87) PCT Pub. No.: WO2017/110481
PCT Pub. Date: Jun. 29, 2017

(65) Prior Publication Data
US 2018/0367745 A1    Dec. 20, 2018

(30) Foreign Application Priority Data
Dec. 21, 2015    (JP) .............................. JP2015-248832

(51) Int. Cl.
*H04N 5/33*    (2006.01)
*H04N 9/04*    (2006.01)
(Continued)

(52) U.S. Cl.
CPC ....... *H04N 5/332* (2013.01); *H01L 27/14831* (2013.01); *H04N 5/2351* (2013.01);
(Continued)

(58) Field of Classification Search
None
See application file for complete search history.

(56) References Cited

U.S. PATENT DOCUMENTS

2004/0169749 A1* 9/2004 Acharya ............... H04N 5/332
                                                    348/279
2005/0231618 A1* 10/2005 Sugiyama ............. H04N 9/083
                                                    348/273
(Continued)

FOREIGN PATENT DOCUMENTS

JP    2010-288083 A    12/2010
JP    2011-233983 A    11/2011
JP    2013-057915 A     3/2013

OTHER PUBLICATIONS

Written Opinion and English translation thereof dated Feb. 21, 2017 in connection with International Application No. PCT/JP2016/086465.

(Continued)

*Primary Examiner* — Twyler L Haskins
*Assistant Examiner* — Wesley J Chiu
(74) *Attorney, Agent, or Firm* — Wolf, Greenfield & Sacks, P.C.

(57) ABSTRACT

The present technology relates to an imaging device and a method for driving it that make it possible to create two kinds of images with less time deviation, and an imaging apparatus.
The imaging device includes a pixel array in which a plurality of pixels is arranged, the pixel including at least a photoelectric conversion section that converts incident light into charge by photoelectric conversion and a charge accumulating section that accumulates charge transferred from the photoelectric conversion section. At least some of pixels in the pixel array perform an operation to transfer charge generated by the photoelectric conversion section to the charge accumulating section at different timings between adjacent pixels. For example, it is possible to apply the present technology to the imaging device, or the like.

15 Claims, 29 Drawing Sheets

(51) Int. Cl.
| | |
|---|---|
| *H04N 5/353* | (2011.01) |
| *H04N 5/3745* | (2011.01) |
| *H04N 5/235* | (2006.01) |
| *H04N 5/243* | (2006.01) |
| *H04N 9/07* | (2006.01) |
| *H04N 5/341* | (2011.01) |
| *H04N 5/374* | (2011.01) |
| *H01L 27/148* | (2006.01) |

(52) U.S. Cl.
CPC ......... *H04N 5/2353* (2013.01); *H04N 5/2354* (2013.01); *H04N 5/243* (2013.01); *H04N 5/33* (2013.01); *H04N 5/341* (2013.01); *H04N 5/3537* (2013.01); *H04N 5/374* (2013.01); *H04N 5/37452* (2013.01); *H04N 9/04551* (2018.08); *H04N 9/04553* (2018.08); *H04N 9/04555* (2018.08); *H04N 9/07* (2013.01)

(56) References Cited

U.S. PATENT DOCUMENTS

| | | | | |
|---|---|---|---|---|
| 2010/0020209 | A1* | 1/2010 | Kim | H04N 3/155 348/294 |
| 2010/0053346 | A1* | 3/2010 | Mitsunaga | H04N 5/23248 348/208.6 |
| 2010/0165167 | A1* | 7/2010 | Sugiyama | H04N 5/335 348/311 |
| 2010/0309333 | A1* | 12/2010 | Smith | H04N 5/235 348/230.1 |
| 2011/0025893 | A1* | 2/2011 | Kim | H04N 5/378 348/294 |
| 2011/0085043 | A1* | 4/2011 | Kamiyama | H04N 5/332 348/164 |
| 2012/0287294 | A1* | 11/2012 | Kaizu | H04N 5/2355 348/208.4 |
| 2013/0002882 | A1* | 1/2013 | Onozawa | H04N 5/2353 348/164 |
| 2013/0063642 | A1 | 3/2013 | Nakaoka | |
| 2014/0184808 | A1* | 7/2014 | Ryoki | H01L 27/14621 348/164 |
| 2016/0065865 | A1* | 3/2016 | Shiokawa | H04N 9/04553 348/164 |
| 2016/0198103 | A1* | 7/2016 | Tanaka | H04N 9/045 348/164 |
| 2016/0317003 | A1* | 11/2016 | Ogata | A61B 1/0638 |
| 2017/0163914 | A1* | 6/2017 | Hara | H04N 5/3537 |
| 2017/0237887 | A1* | 8/2017 | Tanaka | G03B 15/05 348/164 |
| 2018/0146144 | A1* | 5/2018 | Sugiyama | H04N 5/33 |
| 2018/0284576 | A1* | 10/2018 | Nagano | H04N 5/33 |

OTHER PUBLICATIONS

International Preliminary Report on Patentability and English translation thereof dated Jul. 5, 2018 in connection with International Application No. PCT/JP2016/086465.
International Search Report and English translation thereof dated Feb. 21, 2017 in connection with International Application No. PCT/JP2016/086465.

\* cited by examiner

RGBW FILTER

BAYER ARRANGEMENT

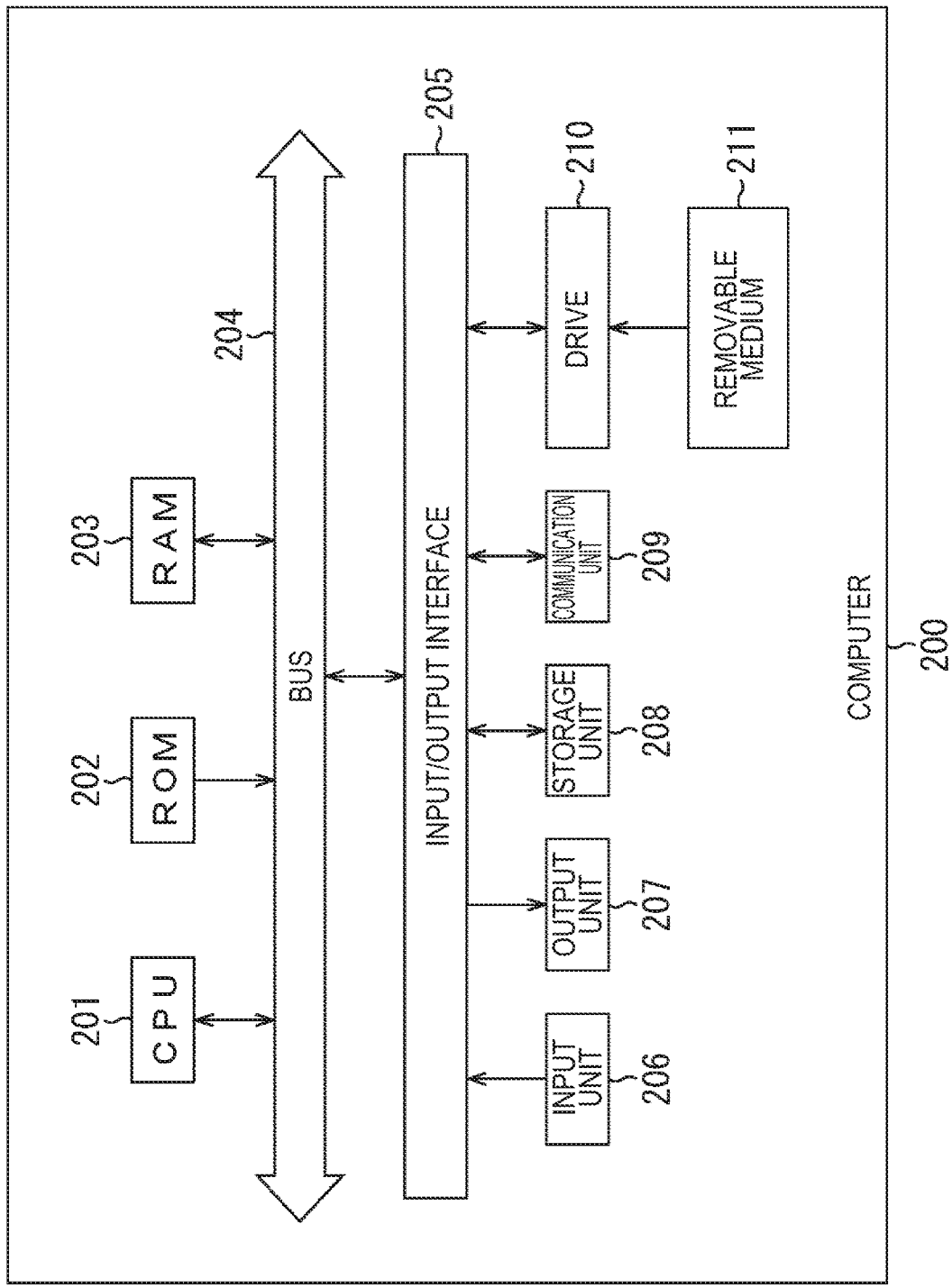

IMAGING DEVICE AND METHOD FOR DRIVING THE SAME, AND IMAGING APPARATUS

This is a U.S. National Stage Application under 35 U.S.C. § 371, based on International Application No. PCT/JP2016/086465, filed Dec. 8, 2016, entitled "IMAGING ELEMENT AND DRIVING METHOD THEREFOR, AND IMAGING DEVICE", which claims priority under 35 U.S.C. § 119(a)-(d) or 35 U.S.C. § 365(b) to Japanese Patent Application JP 2015-248832, filed Dec. 21, 2015, the entire contents of each of which are hereby incorporated herein by reference.

TECHNICAL FIELD

The present technology relates to an imaging device and a method for driving it, and an imaging apparatus, in particular, relates to an imaging device and a method for driving it that make it possible to create two kinds of images with less time deviation, and an imaging apparatus.

BACKGROUND ART

For example, in imaging apparatus, such as a surveillance camera, there are those having improved recognizability by irradiating a photographic object with infrared light and imaging. For example, PTL 1 discloses a technique that repeats lighting on and lighting off of an infrared LED in units of one frame, acquires in every other frame a visible image (color image) and an IR image (monochrome picture) in which contrast has become vivid by infrared light, and synthesizes the visible image and the IR image, thereby creating an image with improved recognizability.

CITATION LIST

Patent Literature

Patent Literature 1: JP 2011-233983A

DISCLOSURE OF INVENTION

Technical Problem

In the method of creating by switching over an IR image and a visible image in units of a frame, a time deviation in units of a frame occurs, and artifacts due to image misalignments occurs at the time of synthesizing.

The present technology has been achieved in view of such a situation, and, makes it possible to create two kinds of images with less time deviation.

Solution to Problem

According to a first aspect of the present technology, an imaging device includes a pixel array in which a plurality of pixels is arranged, the pixel including at least a photoelectric conversion section that converts incident light into charge by photoelectric conversion and a charge accumulating section that accumulates charge transferred from the photoelectric conversion section. At least some of pixels in the pixel array perform an operation to transfer charge generated by the photoelectric conversion section to the charge accumulating section at different timings between adjacent pixels.

According to a second aspect of the present technology, a method for driving an imaging device includes performing an operation to transfer charge generated by a photoelectric conversion section to a charge accumulating section by at least some of pixels at different timings between adjacent pixels in a pixel array in which a plurality of pixels is arranged, the pixel including at least the photoelectric conversion section that converts incident light into charge by photoelectric conversion and the charge accumulating section that accumulates charge transferred from the photoelectric conversion section.

According to the first and the second aspects of the present technology, an operation to transfer charge generated by a photoelectric conversion section to a charge accumulating section is performed by at least some of pixels at different timings between adjacent pixels in a pixel array in which a plurality of pixels is arranged, the pixel including at least the photoelectric conversion section that converts incident light into charge by photoelectric conversion and the charge accumulating section that accumulates charge transferred from the photoelectric conversion section.

According to a third aspect of the present technology, an imaging apparatus includes: an imaging device including a pixel array in which a plurality of pixels is arranged, the pixel including at least a photoelectric conversion section that converts incident light into charge by photoelectric conversion and a charge accumulating section that accumulates charge transferred from the photoelectric conversion section, in which at least some of pixels in the pixel array perform an operation to transfer charge generated by the photoelectric conversion section to the charge accumulating section at different timings between adjacent pixels; and an image signal processing section that creates a first image from a first pixel signal acquired at a first timing in the imaging device, and, creates a second image from a second pixel signal acquired at a second timing.

According to the third aspect of the present technology, an operation to transfer charge generated by a photoelectric conversion section to a charge accumulating section is performed by at least some of pixels at different timings between adjacent pixels in a pixel array in which a plurality of pixels is arranged, the pixel including at least the photoelectric conversion section that converts incident light into charge by photoelectric conversion and the charge accumulating section that accumulates charge transferred from the photoelectric conversion section, and a first image is created from a first pixel signal acquired at a first timing in the imaging device, and a second image is created from a second pixel signal acquired at a second timing.

The imaging apparatus may be an independent device, or, may be an internal block that constitutes one apparatus.

Advantageous Effects of Invention

According to the first to third aspects of the present technology, it is possible to create two kinds of images with less time deviation.

Further, the effects described herein are not necessarily limited, and any effect described in the present disclosure may be included.

BRIEF DESCRIPTION OF DRAWINGS

FIG. 29 is a block diagram showing a constitution example of one embodiment of a computer to which the present technology is applied.

MODE(S) FOR CARRYING OUT THE INVENTION

Figure 1:
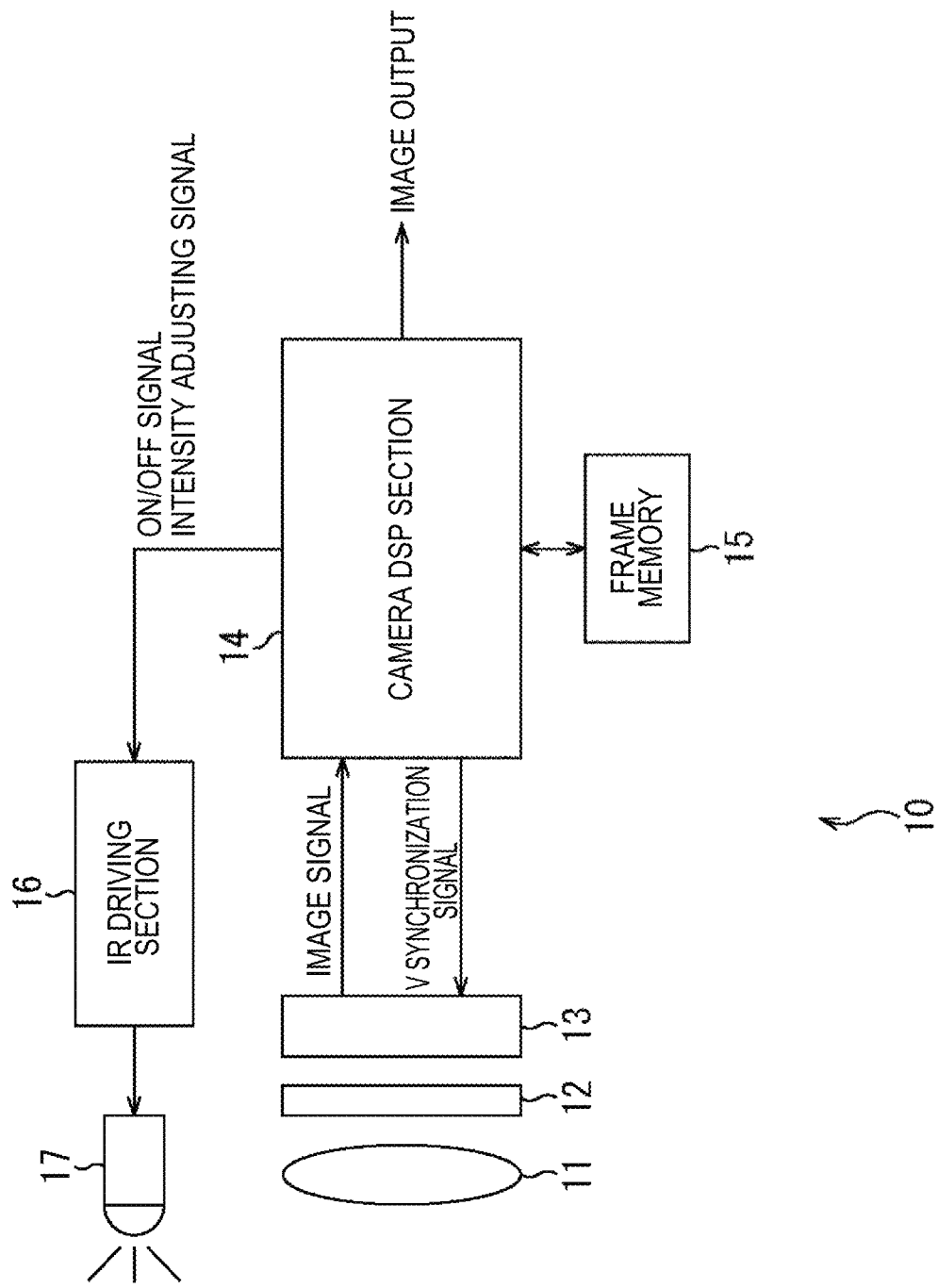
FIG. 1 is a block diagram showing a constitution example of one embodiment of an imaging apparatus to which the present technology is applied.

Hereinafter, a configuration (henceforth, referred to as an embodiment) for executing the present technology will be described. In this connection, the description is given in the following order.

1. Constitution example of imaging apparatus
2. Schematic constitution example of CMOS image sensor
3. Filter arrangement example
4. Wiring example of TRX control line and OFG control line
5. Exposure period control for each pixel
6. Charge read-out control
7. Constitution example of camera DSP Section
8. Color image creation processing by camera DSP section
9. Modified example
10. Application example of other application

1. Constitution Example of Imaging Apparatus

FIG. 1 shows a constitution example of one embodiment of an imaging apparatus to which the present technology is applied.

The imaging apparatus 10 in FIG. 1 is used for, for example, a surveillance camera etc., and creates a color image on the basis of an infrared image acquired in a state where infrared light is irradiated, and a visible image acquired under low illuminance in which infrared light is not irradiated.

The imaging apparatus 10 includes an imaging system constituted similarly to a general camera, an image processing system that executes image processing, and a light projecting system that irradiates infrared light towards an imaging range.

The imaging system of the imaging apparatus 10 includes a lens 11, an IR band pass filter 12, and a CMOS image sensor 13 (hereafter, abbreviated as CMOS sensor 13). In the imaging system, the lens 11 condenses an optical image of a photographic object to the CMOS sensor 13, the IR band pass filter 12 disposed between the lens 11 and CMOS sensor 13 extracts a visible light component and an infrared light component from the optical image of the photographic subject, and the CMOS sensor 13 generates image signals based on incident light, and, outputs to an image processing system.

Figure 2:
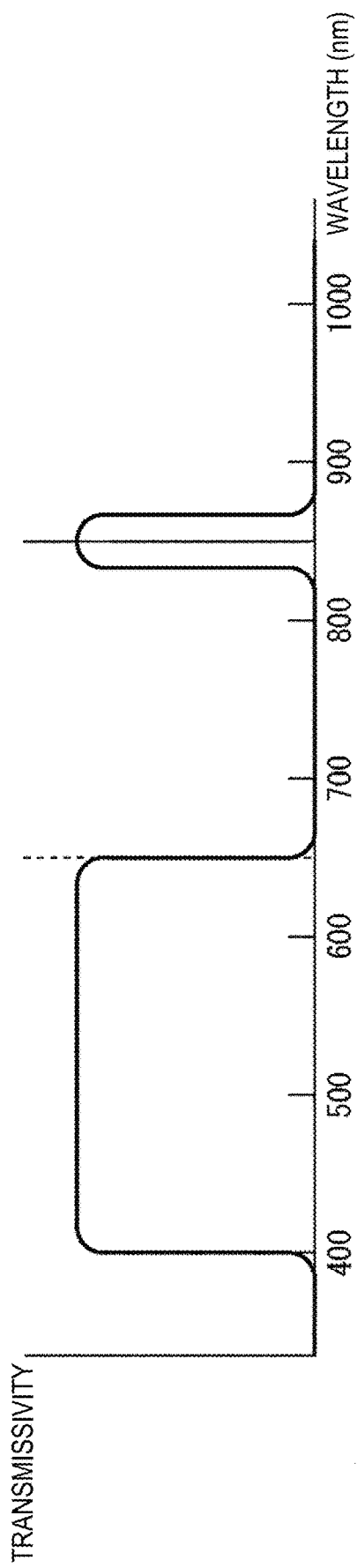
FIG. 2 is a diagram showing transmission characteristics of an IR band pass filter.

FIG. 2 shows the transmission characteristics of the IR band pass filter 12. The IR band pass filter 12 is a dual band pass filter with high transmissivity for a region of wavelengths of 400 nm to 650 nm corresponding to visible light and a region (for example, 850 nm±25 nm) corresponding to wavelengths of infrared light irradiated by the light projecting system.

In this connection, in the present specification, infrared light irradiated by the light projecting system is also referred to as projected IR, and infrared light other than the infrared light irradiated by the light projecting system, such as infrared light contained in sunlight etc., is also referred to as environmental IR.

Returning to FIG. 1, the image processing system of the imaging apparatus 10 includes a camera DSP section 14 and a frame memory 15. The camera DSP section 14 is an image signal processing section that performs signal processing for image signals supplied from the CMOS sensor 13.

The camera DSP section 14 creates, for example, an IR irradiation image from pixels exposed at a timing of ON of a projected IR on the basis of image signals supplied from the CMOS sensor 13, creates a visible image (IR non-irradiation image) from pixels exposed at a timing of OFF of a projected IR, and, outputs. Moreover, the camera DSP section 14 generates V synchronization signals for controlling the driving (exposing and reading out) of the CMOS sensor 13, and outputs to the CMOS sensor 13. Furthermore, the camera DSP section 14 generates driver signals (ON/OFF signals and intensity adjusting signals) for controlling the light projecting system, and outputs to an IR driving section 16. The frame memory 15 holds predetermined image signals temporarily for predetermined signal processing (for example, later-mentioned noise reduction processing) for image signals supplied from the CMOS sensor 13.

The light projecting system of the imaging apparatus 10 includes an IR driving section 16 and an IR irradiating section 17. In the light projecting system, the IR driving section 16 makes the IR irradiating section 17 irradiate infrared light in accordance with the control from the camera DSP section 14. The IR irradiating section 17 irradiates infrared light corresponding to the transmission wavelength band of the IR band pass filter 12 toward an imaging range. In this connection, the IR irradiating section 17 may be disposed in a case body of the imaging apparatus 10, or, may be arranged on the outside of the case body of the imaging apparatus 10.

In the imaging apparatus 10 constituted as mentioned above, the IR irradiating section 17 pulse-irradiates projected IR a timing controlled by the camera DSP section 14. The CMOS sensor 13 performs imaging in synchronization with the timing of projected IR. The camera DSP section 14 creates, for example, an IR irradiation image from pixels exposed at a timing of ON of a projected IR, and, creates a visible image (IR non-irradiation image) from pixels exposed at a timing of OFF of a projected IR. Then, the camera DSP section 14 synthesizes the luminance information of the IR irradiation image and the color difference information of the visible image, and, creates a synthetic image, whereby a color image in which contrast has become vivid, can be acquired.

2. Schematic Constitution Example of CMOS Image Sensor

Figure 3:
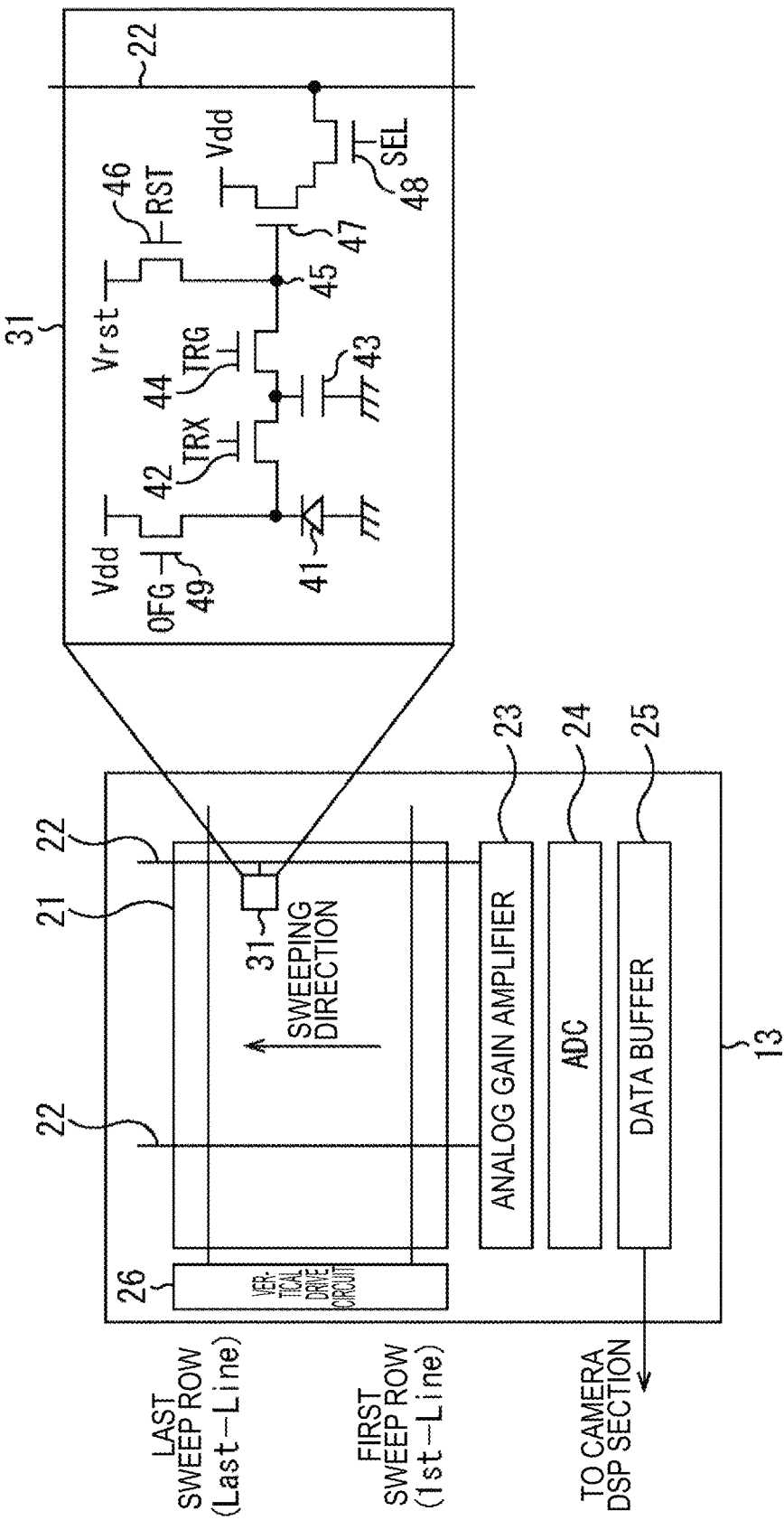
FIG. 3 is a diagram showing a schematic constitution example of a CMOS sensor.

FIG. 3 shows a schematic constitution example of the CMOS sensor 13. This CMOS sensor 13 includes a pixel array 21, vertical signal lines 22, an analog gain amplifier 23, ADC 24, a data buffer 25, and a vertical drive circuit 26. In the pixel array 21, a plurality of pixels 31 is arranged two-dimensionally in a matrix form.

A pixel 31 includes a photodiode 41 serving as a photoelectric conversion element, a first transfer transistor 42, a memory section 43, a second transfer transistor 44, a FD (floating diffusion) 45, a reset transistor 46, an amplification transistor 47, a selection transistor 48, and a discharge transistor 49.

The photodiode 41 is a photoelectric conversion section that generates and accumulates charges (signal charges) correspondingly to an amount of received light. The anode terminal of the photodiode 41 is grounded, and, in addition, the cathode terminal is connected to the memory section 43 via the first transfer transistor 42. Moreover, the cathode terminal of the photodiode 41 is connected also to the discharge transistor 49.

When being turned ON by a transfer signal TRX, the first transfer transistor 42 reads out charges generated by the photodiode 41, and, transfers to the memory section 43. The memory section 43 is a charge accumulating section that accumulates charges temporarily until the charges are transferred to the FD 45. When being turned ON by a transfer signal TRG, the second transfer transistor 44 transfers the charges being accumulated in the memory section 43 to the FD 45.

The FD 45 is a charge holding section that holds temporarily charges read out from the memory section 43 in order to read out as a signal. When being turned ON by a reset signal RST, the reset transistor 46 is connected to a reset voltage Vrst, thereby resetting the electric potential of the FD 45.

The amplification transistor 47 outputs a pixel signal corresponding to the electric potential of the FD 45. That is, the amplification transistor 47 constitutes a source follower circuit with a load MOS (not-shown) of the analog gain amplifier 23, and a pixel signal showing a level corresponding to charges being held by the FD 45 is output from the amplification transistor 47 to the ADC 24 through the selection transistor 48.

The selection transistor 48 is turned ON when the pixel 31 is selected by a selection signal SEL, and, outputs the pixel signal of the pixel 31 to the ADC 24 through the vertical signal line 22. When being turned ON by a discharge signal OFG, the discharge transistor 49 discharges unnecessary charges being accumulated in the photodiode 41 to the constant voltage source Vdd. The transfer signals TRX and TRG, the reset signal RST, the selection signal SEL, and the discharge signal OFG are controlled by the vertical drive circuit 26, and, are supplied to each pixel 31.

An example of the operation of the pixel 31 is described briefly.

First, before starting exposure, by supplying a discharge signal OFG with a High level to the discharge transistor 49, the discharge transistor 49 is turned ON, charges being accumulated in the photodiode 41 are discharged to the constant voltage source Vdd, and the photodiode 41 is reset.

After the photodiode 41 has been reset, the discharge transistor 49 is turned OFF by a discharge signals OFG with a Low level, whereby exposure is started in all the pixels.

When a predetermined prescribed exposure time has elapsed, in all the pixels in the pixel array 21, the first transfer transistor 42 is turned ON by a transfer signal TRX, and charges being accumulated in the photodiode 41 are transferred to the memory section 43.

After the first transfer transistor 42 has been turned OFF, charges being held at the memory section 43 of each pixel 31 are read out to the ADC 24 sequentially in units of a row. In the read-out operation, the second transfer transistor 44 of the pixel 31 on a read-out row is turned ON by a transfer signal TRG, and charges being held in the memory section 43 are transferred to the FD 45. Successively, the selection transistor 48 is turned ON by a selection signal SEL, whereby a signal showing a level corresponding to the charges being held at the FD 45 is output from the amplification transistor 47 to the ADC 24 through the selection transistor 48.

In the CMOS sensor 13, the pixel signal of each of the pixels 31 in the pixel array 21 is read out for each row in accordance with a sweeping direction from a sweep start row (First-Line) to a last row (Last-Line).

The read-out pixel signals are output to the analog gain amplifier 23 via the vertical signal lines 22, amplified, converted into digital pixel signals by the ADC 24, and stored in the data buffer 25. In this connection, the gain in the analog gain amplifier 23 can be adaptively set accordingly to the lighting. Successively, pixel signals of all the pixels constituting the pixel array 21 are output as image signals to the camera DSP section 14 at the latter stage.

3. Filter Arrangement Example

Figure 4:
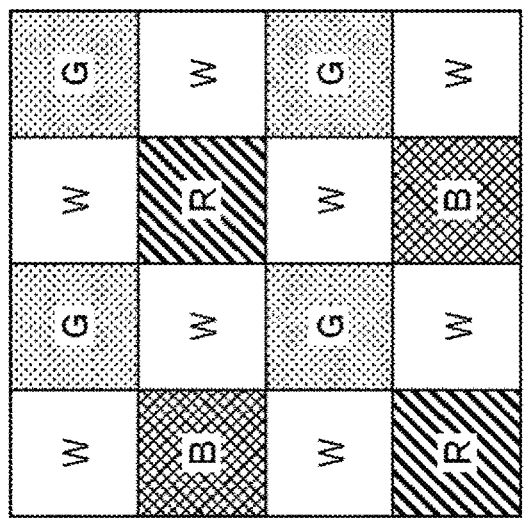
FIG. 4 is an illustration showing a filter arrangement of a pixel array.

FIG. 4 shows a filter arrangement of filters disposed on the upper sides of the photodiodes 41 in respective pixels 31 in the pixel array 21.

The filter arrangement of the pixel array 21 is made a RGBW filer in which, as shown in FIG. 4, W filters are arranged in a checkered pattern, and at pixel positions other than those, R, G, and B filers are arranged. Here, the R, G, and B filers are color filters to allow light of wavelength regions of R (red), G (Green) and B (Blue) to pass through respectively, and the W filer is a white filter (transparent filter) to allow light of the entire wavelength region to pass through. Therefore, a pixel 31 at which a W filter is disposed, can receive light of the respective wavelength regions of R, G, and B and light of an infrared region that have passed through the IR band pass filter 12.

It should be noted that, in the following, a pixel 31 at which a w filter is disposed is also referred to as a W pixel, and pixels 31 at which R, G, and B filters are disposed respectively are also referred to as an R pixel, a G pixel, and a B pixel. Moreover, in the case where there is no need to distinguish the R pixel, the G pixel, and the B pixel in particular, and it is permissible to merely distinguish them from the W pixel, these pixels may be collectively referred to as RGB pixels.

4. Wiring Example of TRX Control Line and OFG Control Line

Figure 5:
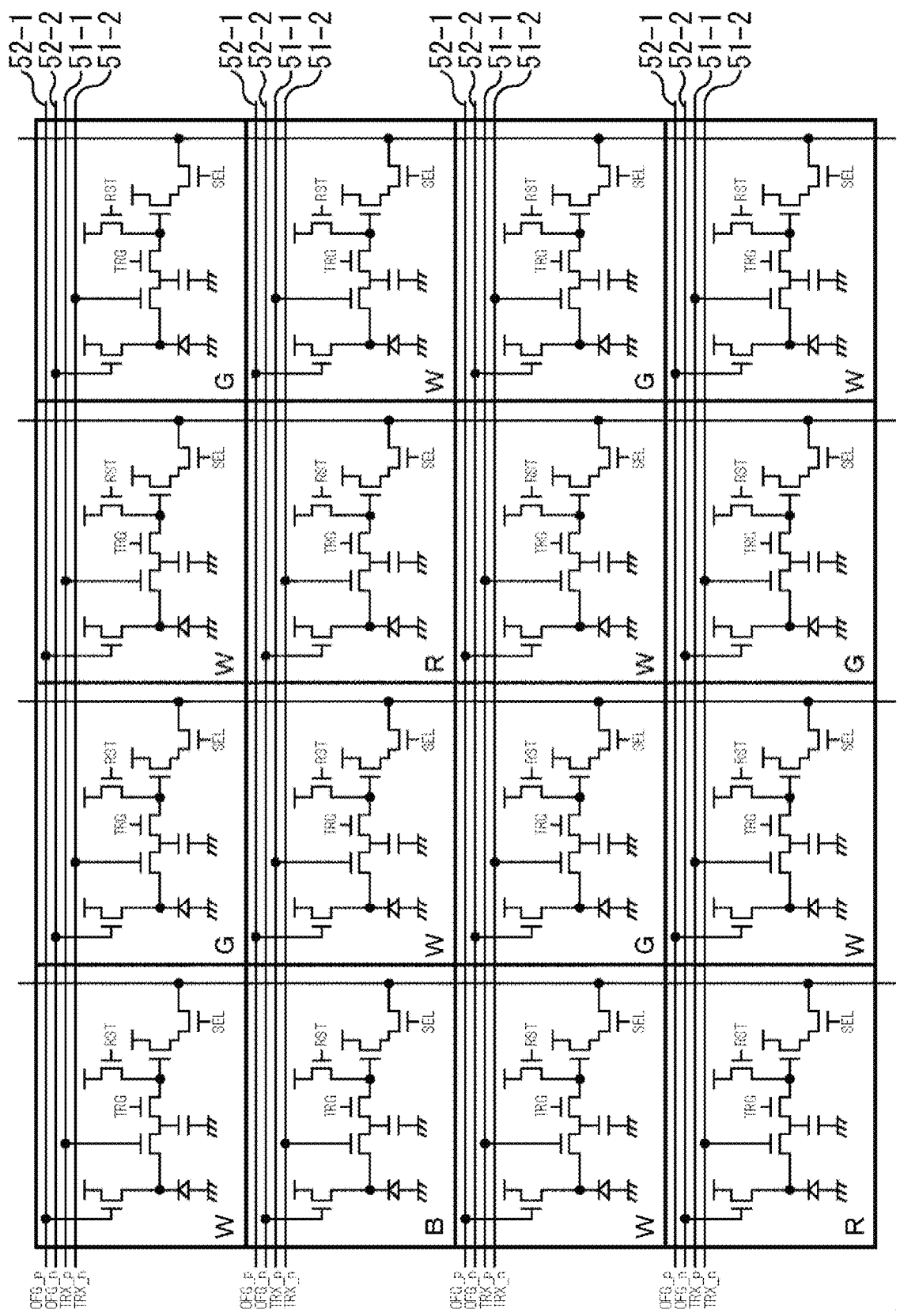
FIG. 5 is a diagram showing a wiring example of drive control lines of a pixel array.

FIG. 5 shows a wiring example of drive control lines for driving each pixel 31 in the pixel array 21.

In this regard, in FIG. 5, in order to avoid the diagram from becoming complicated, the illustration of the reference numerals of the photodiode 41, transistors, and the like of each pixel 31 is omitted.

The TRX control line 51 is a control line to transmit a transfer signal TRX to control the first transfer transistor 42 of the pixel 31. In the pixel array 21, two TRX control lines 51 of TRX control lines 51-1 and 51-2 are arranged for each row.

On each row in the pixel array 21, a pixel 31 in which the first transfer transistor 42 is connected to the TRX control line 51-1 and a pixel 31 in which the first transfer transistor 42 is connected to the TRX control line 51-2, are arranged alternately. In the case where a transfer signal TRX transmitted through the TRX control line 51-1 is called a transfer signal TRX_p, and a transfer signal TRX transmitted through the TRX control line 51-2 is called a transfer signal TRX_n with distinction, a pixel 31 controlled by the transfer signal TRX_p and a pixel 31 controlled by the transfer signal TRX_n are arranged alternately in the horizontal direction and the vertical direction.

The OFG control line 52 is a control line to transmit a discharge signals OFG to control the discharge transistor 49 of the pixel 31. In the pixel array 21, two OFG control lines 52 of OFG control lines 52-1 and 52-2 are arranged for each row.

On each row in the pixel array 21, a pixel 31 in which the discharge transistor 49 is connected to the OFG control line 52-1 and a pixel 31 in which the discharge transistor 49 is connected to the OFG control line 52-2, are arranged alternately. In the case where a discharge signal OFG transmitted through the OFG control line 52-1 is called a discharge signal OFG_p, and a discharge signal OFG transmitted through the OFG control line 52-2 is called a discharge signal OFG_n with distinction, a pixel 31 controlled by the discharge signal OFG_p and a pixel 31 controlled by the discharge signal OFG_n are arranged alternately in the horizontal direction and the vertical direction.

In relation to the filter arrangement in the pixel array 21 having been described with reference to FIG. 4, all the pixels 31 controlled by the transfer signal TRX_p and the discharge signal OFG_p are made the W pixel, and the pixels 31 controlled by the transfer signal TRX_n and the discharge signal OFG_n are made RGB pixels. With this, in the CMOS sensor 13, it becomes possible to set different exposure periods between the W pixel and the RGB pixels.

5. Exposure Period Control for Each Pixel

Figure 6:
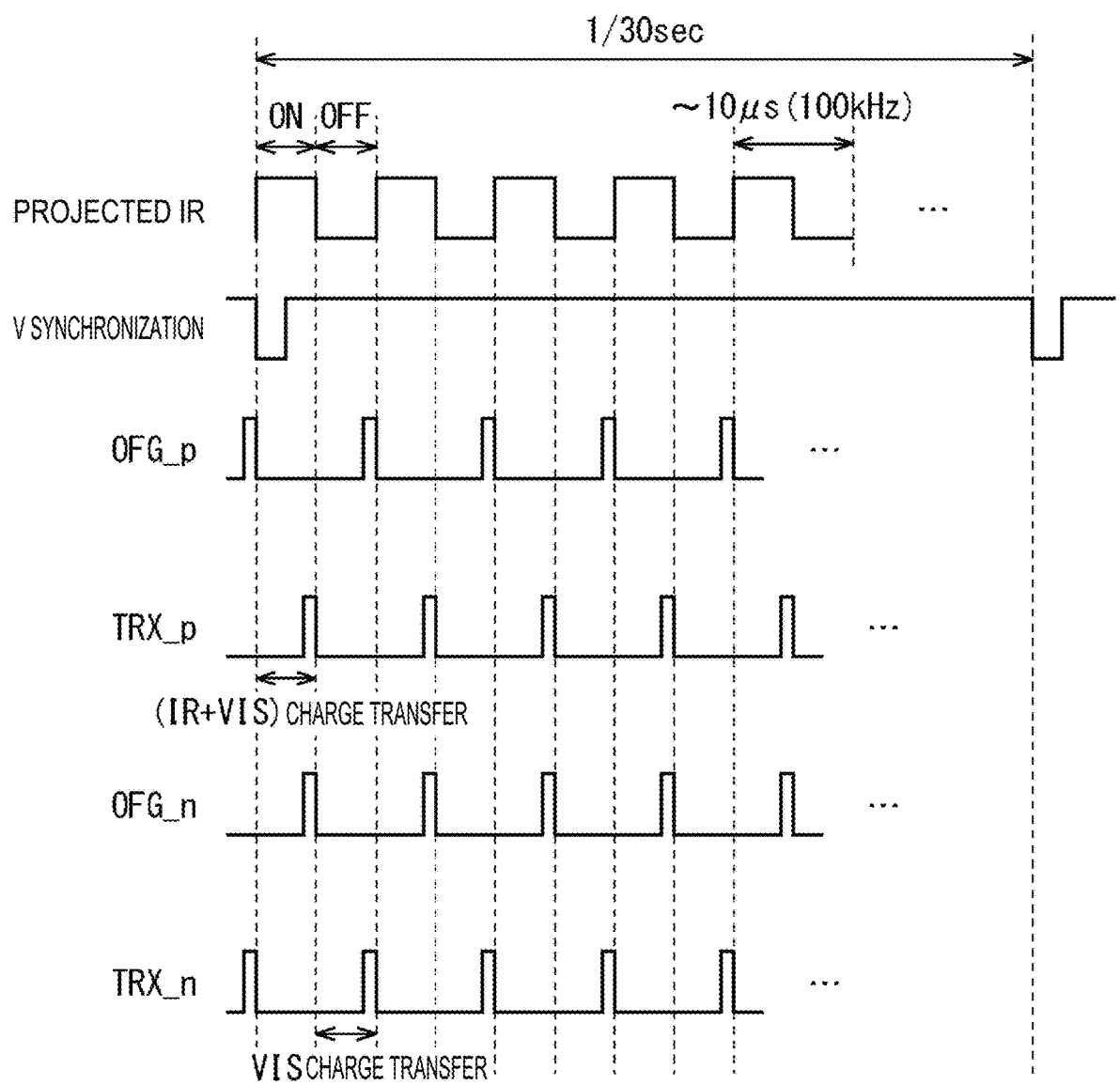
FIG. 6 is a timing chart showing a control timing of an exposure period.

FIG. 6 is a timing chart showing a control timing for an exposure period of each pixel 31 in the pixel array 21.

The IR irradiating section 17 pulse-irradiates projected IR. The IR irradiating section 17 performs pulse irradiation with a high-speed cycle to an extent that an IR irradiation period (ON period) and an IR non-irradiation period (OFF period) can be deemed simultaneous with each other with respect to one frame period (for example, 1/30 sec). For example, in the case where the IR irradiation section 17 performs pulse irradiation at a cycle of 100 kHz, one pulse becomes 10 µsec, and it can be considered that an IR irradiation period and an IR non-irradiation period are simultaneous with each other.

The vertical drive circuit 26 of the CMOS sensor 13 drives each pixel 31 such that a W pixel in the pixel array 21 is made a projected IR receiving pixel that receives light at a timing when projected IR has been irradiated, and that each of RGB pixels in the pixel array 21 is made a visible light receiving pixel that receives light at a timing when projected IR is not irradiated.

In concrete terms, with regard to the W pixel, the vertical drive circuit 26 makes the exposure period correspond to an IR irradiation period, sets the discharge signal OFG_p to ON immediately before the start of an IR irradiation period so as to discharge the accumulated charges till then, and sets the transfer signal TRX_p to ON immediately before the end of the IR irradiation period so as to transfer the charges generated by the photodiode 41 to the memory section 43. In the memory section 43 of the W pixel, charges generated by the photodiode 41 during a plurality of IR irradiation periods occurring during one frame period, are accumulated. The charges accumulated in the memory section 43 of the W pixel become a signal of an IR irradiation image. The phrase "(IR+VIS) charge transfer" shown in FIG. 6 means that accumulated charges corresponding to incident light of both an infrared region (IR) and a visible light region (VIS) are transferred.

On the other hand, with regard to RGB pixels, the vertical drive circuit 26 controls so as to operate on a reverse phase to the W pixel. Namely, the vertical drive circuit 26 makes the exposure period correspond to an IR non-irradiation period, sets the discharge signal OFG_n to ON immediately before the start of an IR non-irradiation period so as to discharge the accumulated charges till then, and sets the transfer signal TRX_n to ON immediately before the end of the IR non-irradiation period so as to transfer the charges generated by the photodiode 41 to the memory section 43. In the memory section 43 of the RGB pixels, charges generated by the photodiode 41 during a plurality of IR non-irradiation periods occurring during one frame period, are accumulated. The charges accumulated in the memory section 43 of the RGB pixel become a signal of an IR non-irradiation image. The phrase "VIS charge transfer" shown in FIG. 6 means that accumulated charges corresponding to incident light of a visible light region (VIS) are transferred. In the case of the R pixel, the accumulated charges are generated by photoelectrically converting the wavelength light of R, in the case of the G pixel, the accumulated charges are generated by photoelectrically converting the wavelength light of G, and in the case of the B pixel, the accumulated charges are generated by photoelectrically converting the wavelength light of B.

Figure 7:
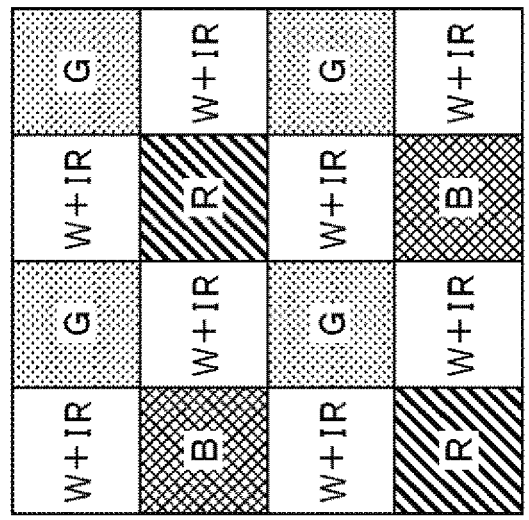
FIG. 7 is an illustration for describing light receiving of each pixel in a pixel array.

As mentioned above, the CMOS sensor 13 assigns the IR irradiation period to the W pixel, assigns the IR non-irradiation period to the RGB pixels, and performs repeatedly an operation to expose with light and transfer charges for pixels adjacent in the row direction at the respective different timings. With this, as shown in FIG. 7, the W pixel receives the visible light of R, G, and B and the projected IR, the R pixel receives the wavelength light of R, the G pixel receives the wavelength light of G, and the B pixel receives the wavelength light of B.

6. Charge Read-Out Control

Figure 8:
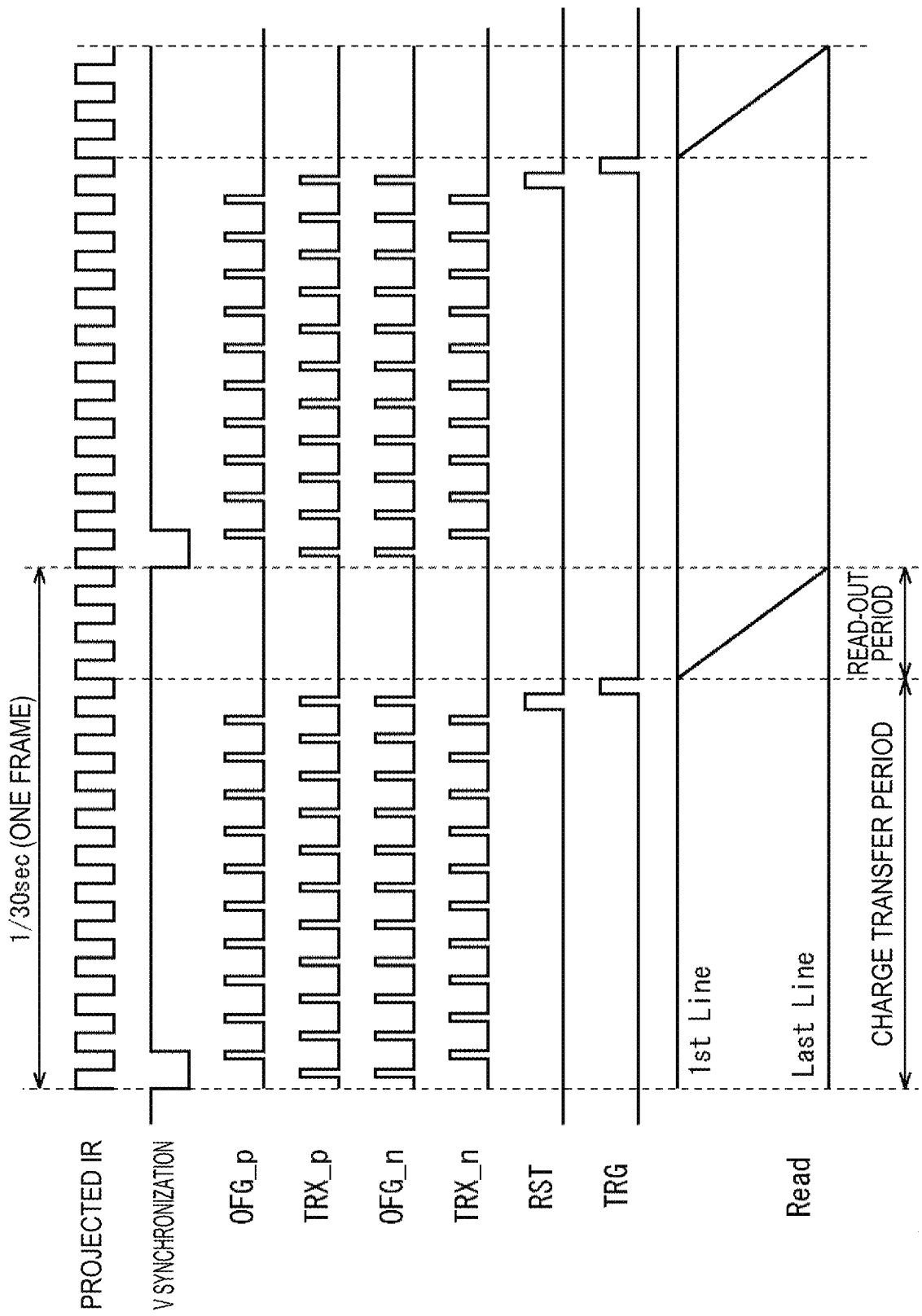
FIG. 8 is a diagram for describing a method of reading out charges of each pixel.

Next, with reference to FIG. 8, a method of reading out charges accumulated in each pixel in the pixel array 21 is described.

FIG. 8 is a timing chart showing a read-out timing for the accumulated charges of each pixel 31 in the pixel array 21.

One frame period is divided into a charge transfer period in which charges are transferred to the memory section 43 and accumulated and a read-out period during which accumulated charges are read out to the ADC 24. In the charge transfer period, in accordance with the control of the transfer signals TRX_p and TRX_n described with reference to FIG. 6, the W pixel and the RGB pixels perform generation of charges by the photodiode 41 and accumulation to the memory section 43 in synchronization with respective pulse irradiation timings.

Successively, immediately before the end of the charge transfer period, a reset signal RST is set to a High level, and the reset transistor 46 is turned ON, whereby the electric potential of FD 45 was reset. Thereafter, the transfer signal TRG is set to a High level, and the second transfer transistor 44 is turned ON, whereby charges accumulated in the memory section 43 are transferred to the FD 45. This charge transfer operation to the FD 45 is simultaneously performed in all the pixels in the pixel array 21.

Subsequently, in the read-out period, a signal showing a level corresponding to charges being held at the FD 45 of each row is output from the amplification transistor 47 in accordance with the sweeping direction shown in FIG. 3 sequentially for each row to the ADC 24 via the selection transistor 48.

With the above operation, in the pixel array 21 of the CMOS sensor 13, the exposure operation deemed as being substantially simultaneous in all the pixels can be performed, and, moreover, a global shutter function becomes realizable.

7. Constitution Example of Camera DSP Section

Figure 9:
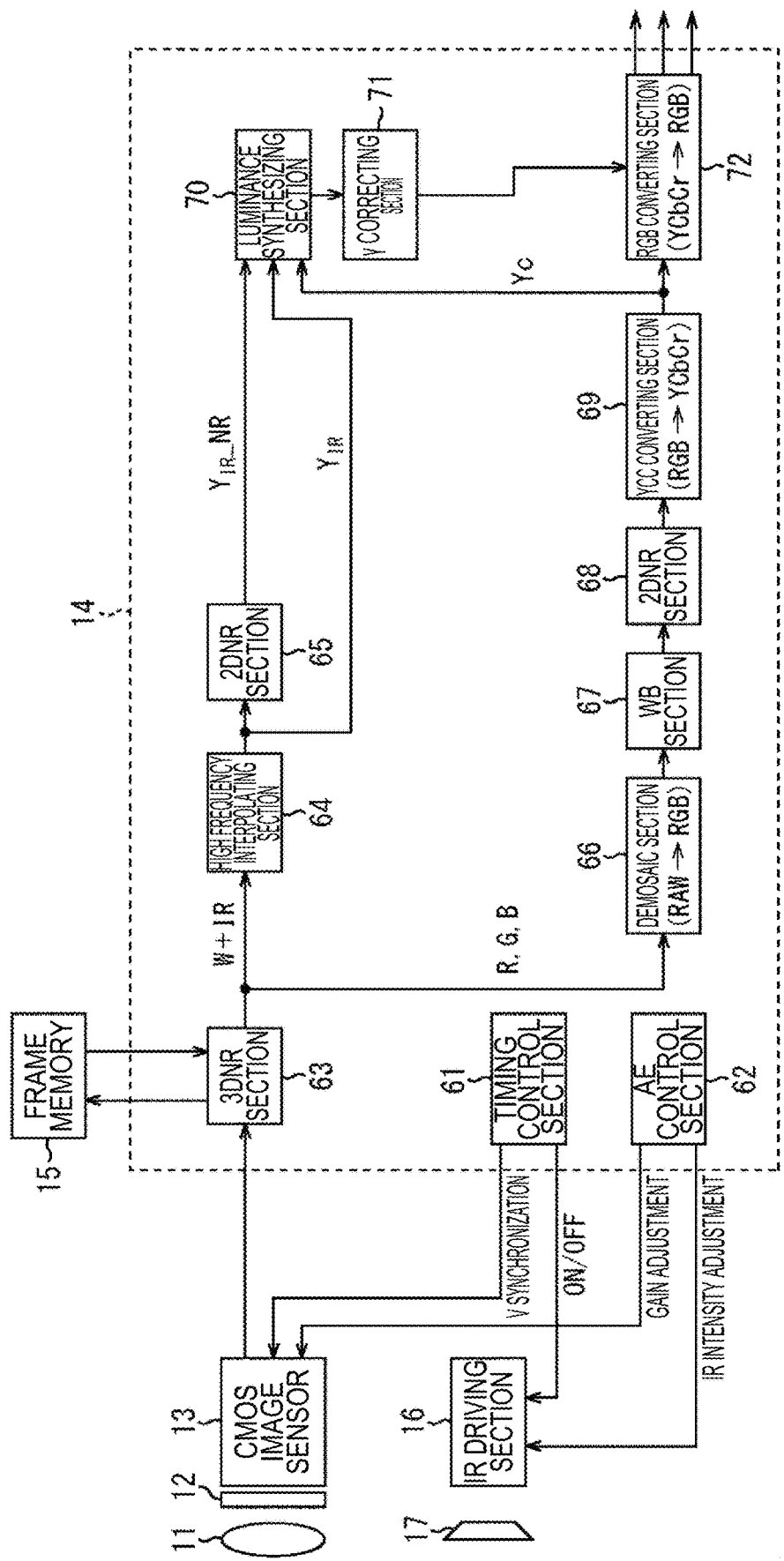
FIG. 9 is a block diagram showing the first constitution example of a camera DSP section.

FIG. 9 shows a constitution example (the first constitution example) of the camera DSP section 14 that performs signal processing for image signals acquired by the drive control shown in FIG. 6 and FIG. 8.

The camera DSP section 14 includes a timing control section 61, an AE control section 62, and a 3DNR section 63.

The timing control section 61 generates a V synchronization signal for performing drive control for the CMOS sensor 13 and an ON/OFF signal for controlling the IR driving section 16. The AE control section 62 generates a gain adjustment signal for controlling the analog gain amplifier 23 in the CMOS sensor 13 and an intensity signal for controlling the IR driving section 16.

The 3DNR section 63 performs 3DNR processing made by combining 2DNR processing that removes noise two-dimensionally through filtering processing for each pixel and its peripheral pixels of an image of a present frame input from the CMOS sensor 13 and time direction processing that performs weighted averaging between an image in the present frame input from the CMOS sensor 13 and an image having been subjected to the 3DNR processing in the past frame (before one frame period) held in a frame memory 15. In this connection, the value in the weighting for an image in the present frame in the time direction processing is called a feedback ratio, and the feedback ratio here is set to, for example, ⅛, ½, and the like.

An image in the present frame having been subjected to the 3DNR processing in the 3DNR section 63 is overwritten and recorded in the frame memory 15.

The latter stage than the 3DNR section 63 is divided into a luminance signal processing system that processes pixel signals acquired from the W pixels among respective pixels of the image of the present frame supplied from the CMOS sensor 13 and a visible image processing system that processes pixel signals acquired from the RGB pixels.

The luminance signal processing system in the latter stage than the 3DNR section 63 includes a high frequency interpolating section 64 and a 2DNR section 65.

To the high frequency interpolating section 64, among the images of the present frame having been subjected to the 3DNR processing in the 3DNR section 63, the signals (W+IR signals) of the W pixels are supplied. The high frequency interpolating section 64 calculates pixel data of the RGB pixel portions by interpolation processing from the pixel data of each of the W pixels arranged in the checkered pattern, and, creates an IR irradiation image in which the pixel data of each pixel is constituted by luminance information $Y_{IR}$. The high frequency interpolating section 64 outputs the pixel data (luminance information $Y_{IR}$) of each pixel of the IR irradiation image of the present frame to the 2DNR section 65 and a luminance synthesizing section 70.

The 2DNR section 65 performs two-dimensional noise reduction processing for the luminance information $Y_{IR}$ of each pixel of the IR irradiation image, thereby extracting its low-frequency component, and, outputs luminance information $Y_{IR\_}$NR acquired as a result to the luminance synthesizing section 70.

The visible image processing system of the camera DSP section 14 includes a demosaic section 66, a white balance (WB) section 67, the 2DNR section 68, and a YCC converting section 69.

To the demosaic section 66, among the images of the present frame having been subjected to the 3DNR processing in the 3DNR section 63, the signals (R signals, G signals, B signals) of RGB pixels are supplied. By performing the demosaic processing, from the pixel data of the RGB pixels of the present frame having been subjected to the 3DNR processing, the demosaic section 66 crates a visible image in which each pixel is constituted by RGB data including color information of R, G, and B, and, outputs to the white balance section 67.

The white balance section 67 performs white balance processing for the image signals (RGB data) of the visible image, and outputs the visible image after the white balance processing to the 2DNR section 68. For the visible image, after the white balance processing, supplied from the white balance section 67, the 2DNR section 68 performs two-dimensional noise reduction processing (2DNR processing) using wide area filters, such as ε filter, and, outputs to the YCC converting section 69.

The YCC converting section 69 converts the visible image after the 2DNR processing in which each pixel is constituted by RGB data, into a visible image (YCC data) in which each pixel includes luminance information Yc and color difference information Cb and Cr, outputs the luminance information Yc to the luminance synthesizing section 70, and outputs the color difference information Cb and Cr to the RGB converting section 72.

The camera DSP section 14 includes the luminance synthesizing section 70, a γ correcting section 71, and the RGB converting section 72 as a color image creating system that creates a color image with improved visibility from the outputs of the luminance signal processing system and the visible image processing system.

The luminance synthesizing section 70 synthesizes the luminance information $Y_{IR}$ and the luminance information $Y_{IR}\_NR$ of the IR irradiation image supplied from the luminance signal processing system, and the luminance information Yc of the visible image supplied from the visible image processing system, thereby calculating the luminance information Ysym as luminance signals of a color image created in the latter stage.

In this connection, in the case where the luminance information $Y_{IR}$ of the IR irradiation image is made into the luminance signals of a color image as it is without passing through the luminance synthesizing section 70, in a photographic object in which the reflectivity of infrared light and the reflectivity of visible light are different greatly from each other, color reproduction will deteriorate due to the difference in luminance information. For example, in black clothes etc. with high infrared reflectivity (the reflectivity of visible light is low), in the case where the luminance information $Y_{IR}$ of an IR irradiation image is used as luminance information as it is, it will become white clothes in an output image. By providing the luminance synthesizing section 70, it becomes possible to prevent such fault.

Figure 10:
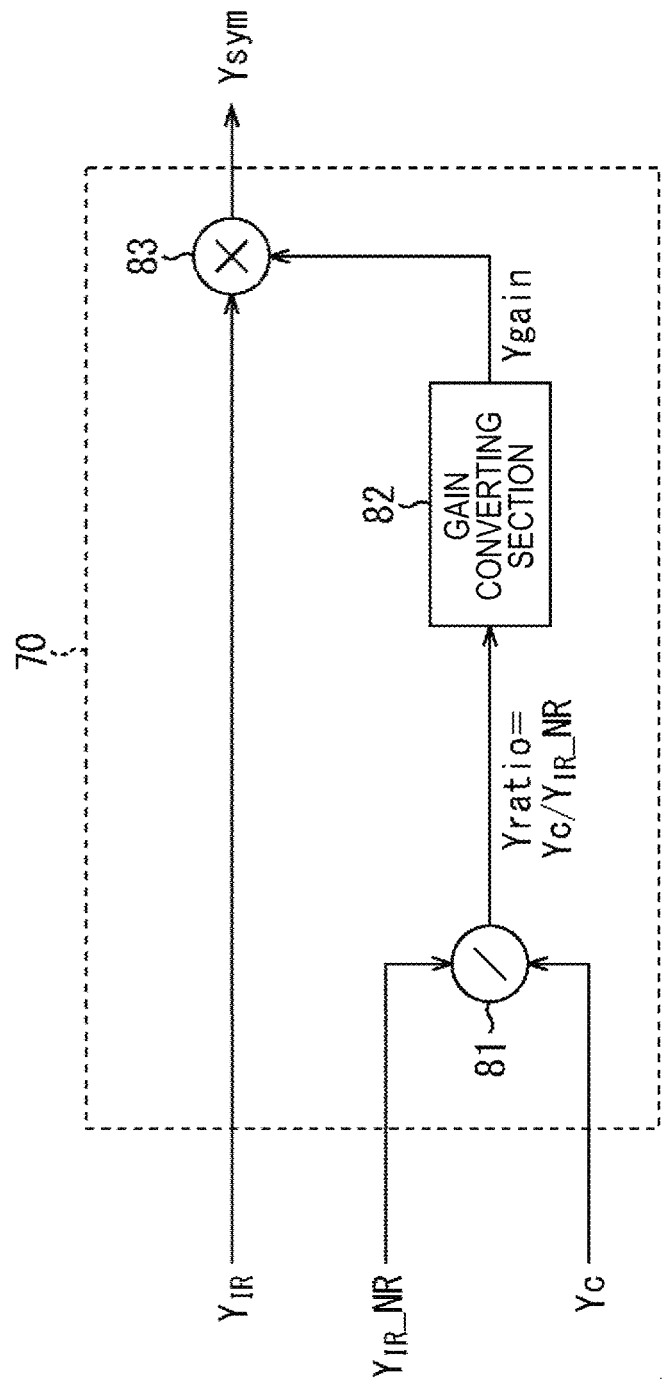
FIG. 10 is a block diagram showing a detailed constitution example of a luminance synthesizing section.

FIG. 10 shows a detailed constitution example of the luminance synthesizing section 70.

The luminance synthesizing section 70 includes a division section 81, a gain converting section 82, and a multiplication section 83. The division section 81 calculates a ratio Yratio=Yc/$Y_{IR}\_NR$ of the luminance information Yc of the visible image to the luminance information $Y_{IR}\_NR$ of the IR irradiation image, and outputs the acquired ratio Yratio to the gain converting section 82. The gain converting section 82 converts the ratio Yratio into Ygain in accordance with a predetermined function (or a translation table to hold), and outputs to the multiplication section 83.

Here, the function used in the gain converting section 82 is described. The luminance synthesizing section 70, basically, multiplies back (multiply) the luminance information $Y_{IR}$ of the original IR irradiation image by this ratio Yratio, thereby performing processing to modulate the luminance information $Y_{IR}$ with a Yc signal. However, only with the multiplying back, the whole screen tends to become dark, and the modulation degree with Yc cannot be adjusted. Then, in the gain converting section 82, the ratio Yratio is converted into Ygain using a nonlinear function curve.

Figure 11:
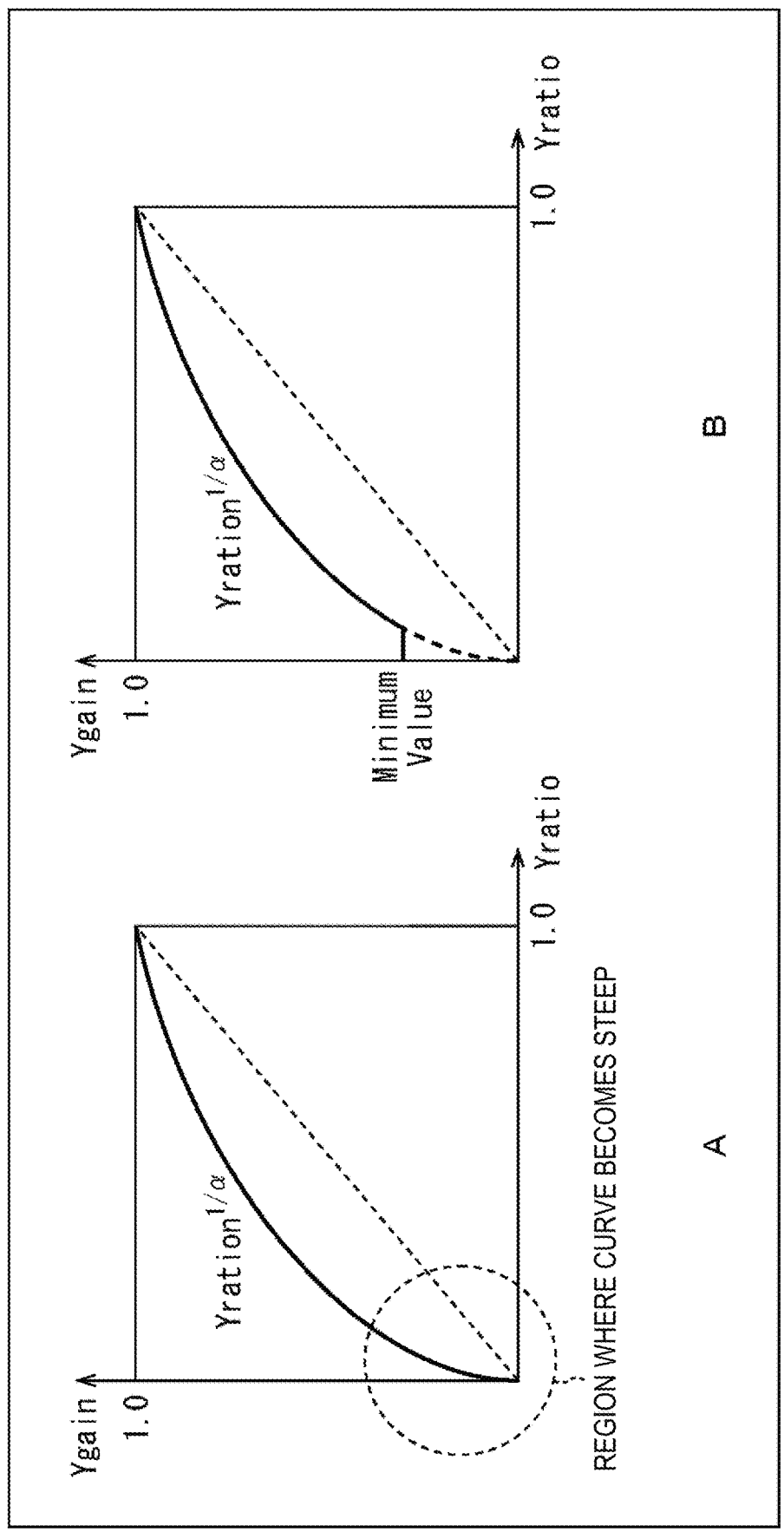
FIG. 11 is a diagram for describing processing in a gain converting section.

A in FIG. 11 shows an exponential function similar to a gamma curve as one example of the nonlinear function used in the gain converting section 82. In this case, by selecting an exponent value α, it becomes possible to adjust the degree of modulation. For example, in the case where the value of α is made larger, Ygain becomes close to 1 on the whole, and the degree of modulation becomes weaker. On the contrary, in the case where the value of α is made smaller, Ygain diverges from 1, and the degree of modulation becomes larger.

However, in the exponential curve as shown in A in FIG. 11, inclination becomes steep in a region where the value of Yratio is small, and due to a slight difference of Yratio, Ygain greatly fluctuates, which may become a cause of amplifying noise. Then, in order to avoid such fault, as shown in B in FIG. 11, in a region where Yratio is small, Ygain is clipped (set a minimum value). In this connection, in place of using such a function, the gain converting section 82 may be made to hold a conversion table prepared beforehand.

Returning to FIG. 10, the multiplication section 83 multiplies back (multiply) the luminance information $Y_{IR}$ of the IR irradiation image by Ygain, thereby calculating luminance information Ysym as luminance signals of a color image, and outputs to the γ correcting section 71 in the latter stage.

Returning to FIG. 9, the γ correcting section 71 performs γ correction processing for the luminance information Ysym supplied from the luminance synthesizing section 70, and outputs the luminance information Ysym after the γ correction processing to the RGB converting section 72.

The RGB converting section 72 creates one sheet of a color image in which each pixel has color information of R, G, and B, on the basis of the color difference information Cb and Cr of the visible image supplied from the YCC converting section 69 and the luminance information Ysym after the γ correction processing supplied from the γ correcting section 71, and outputs to the latter stage. The color image created by the RGB converting section 72 is a color image in which contrast has become vivid by having used the luminance information of the IR irradiation image.

8. Color Image Creation Processing by Camera DSP Section

Figure 12:
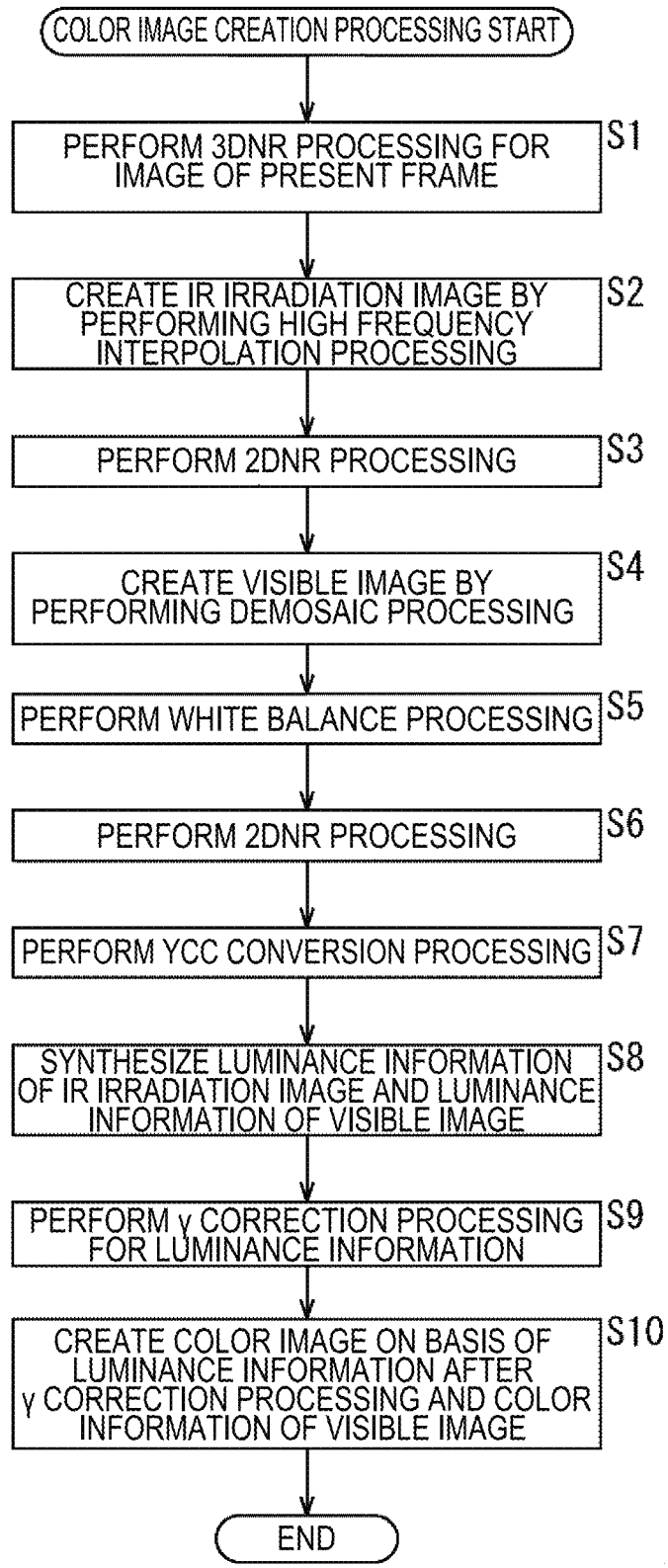
FIG. 12 is a flowchart for describing color image creation processing by a camera DSP section.

Next, with reference to a flowchart in FIG. 12, the color image creation processing by the camera DSP section 14 is described. This color image creation processing is executed, for example, when the image signals of the present frame have been supplied from the CMOS sensor 13.

First, in Step S1, the 3DNR section 63 performs 3DNR processing for the image of the present frame supplied from the CMOS sensor 13, and, overwrites the image of the present frame having been subjected to the 3DNR processing, and records in the frame memory 15. Moreover, the 3DNR section 63 outputs the pixel signals of the W pixels among the image of the present frame having been subjected to the 3DNR processing to the high frequency interpolating section 64, and, outputs the pixel signals of the RGB pixels to the demosaic section 66.

In step S2, the high frequency interpolating section 64 creates the IR irradiation image of the present frame by performing high frequency interpolation processing using the pixel signals of the W pixels supplied from the 3DNR section 63. That is, the high frequency interpolating section 64 calculates the pixel data of the RGB pixel portion by the interpolation processing from the pixel data of each of the W pixels arranged in the checkered pattern, and, creates the IR irradiation image in which the pixel data of each pixel are constituted by the luminance information $Y_{IR}$. Then, the high frequency interpolating section 64 outputs the pixel data (luminance information $Y_{IR}$) of each pixel of the IR irradiation image of the present frame to the 2DNR section 65 and the luminance synthesizing section 70.

In Step S3, the 2DNR section 65 performs the two-dimensional noise reduction processing for the luminance information $Y_{IR}$ of each pixel of the IR irradiation image, thereby extracting its low-frequency component by, and outputs the luminance information $Y_{IR}\_NR$ acquired as a result to the luminance synthesizing section 70.

In step S4, the demosaic section 66 creates the visible image of the present frame by performing demosaic processing. That is, the demosaic section 66 creates the visible image constituted by the RGB data in which each pixel has color information of R, G, and B, from the pixel data of the RGB pixels of the present frame having been subjected to the 3DNR processing, and outputs to the white balance section 67. In the demosaic processing, for example, a region of 4 pixels×4 pixels is made a unit region, and, on the basis of the color information of the R pixels, the G pixels, and the B pixels in the unit region, the color information of R, G, and B of each pixel in the unit region is created.

In Step S5, the white balance section 67 performs white balance processing for the image signals (RGB data) of the visible image, and outputs the visible image after the white balance processing to the 2DNR section 68.

In Step S6, the 2DNR section 68 performs 2DNR processing for the visible image (RGB data) after the white balance processing, and outputs to the YCC converting section 69.

In Step S7, the YCC converting section 69 performs YCC conversion processing to convert the visible image after the 2DNR processing in which each pixel is constituted by the RGB data into a visible image of the YCC data composed of luminance information Yc and color difference information Cb and Cr. That is, the YCC converting section 69 converts the visible image after the 2DNR processing in which each pixel is constituted by the RGB data into a visible image in which each pixel has the luminance information Yc and the color difference information Cb and Cr, outputs the luminance information Yc to the luminance synthesizing section 70, and outputs the color difference information Cb and Cr to the RGB converting section 72.

Since the processing in Steps S2 and S3 mentioned above is the processing in the luminance signal processing system and the processing in Steps S4 to S7 is the processing in the visible image processing system, both can be performed in parallel. Alternatively, the processing in Steps S4 to S7 may be executed before the processing in Step S2 and S3.

In Step S8, the luminance synthesizing section 70 calculates luminance information Ysym as luminance signals of a color image created in the latter stage by synthesizing the luminance information $Y_{IR}$ and the luminance information $Y_{IR}\_NR$ of the IR irradiation image supplied from the luminance signal processing system and the luminance information Yc of the visible image supplied from the visible image processing system, and, outputs to the γ correcting section 71.

In Step S9, the γ correcting section 71 performs γ correction processing for the luminance information Ysym supplied from the luminance synthesizing section 70, and outputs the luminance information Ysym after the γ correction processing to the RGB converting section 72.

In Step S10, the RGB converting section 72 creates one sheet of a color image in which each pixel has color information of R, G, and B, on the basis of the luminance information Ysym after the γ correction processing supplied from the γ correcting section 71 and the color difference information Cb and Cr of the visible image supplied from the YCC converting section 69, and outputs to the latter stage. With the above, the color image creation processing is ended.

According to the color image creation processing having been described in the above, an IR irradiation image corresponding to an IR irradiation period and a visible image corresponding to an IR non-irradiation period are created from image signals acquired during one frame period. Then, by using luminance information Ysym created from the IR irradiation image and the color difference information Cb and Cr of the visible image, it becomes possible to create a color image in which contrast has become vivid.

In the imaging apparatus 10, the CMOS sensor 13 is driven and controlled such that W pixels are exposed to light in synchronization with an IR irradiation period and RGB pixels are exposed to light in synchronization with an IR non-irradiation period, whereby an IR irradiation image and a visible image can be created from image signals of one frame. Therefore, both the IR irradiation image and the visible image can be acquired during one frame period, and the IR irradiation image and the visible image can be created with less time deviation.

A time difference between the IR irradiation image and the visible image becomes lost. Accordingly, artifact due to image misalignment in a color image synthesized by using the IR irradiation image and the visible image does not occur. Moreover, since there is no time difference between the IR irradiation image and the visible image, a frame buffer for compensating a time difference between two images becomes unnecessary, and system cost is reduced.

9. Modified Example

Next, a modified example of the above-mentioned embodiment (henceforth, also referred to as a basic embodiment) is described.

First Modified Example

Figure 13:
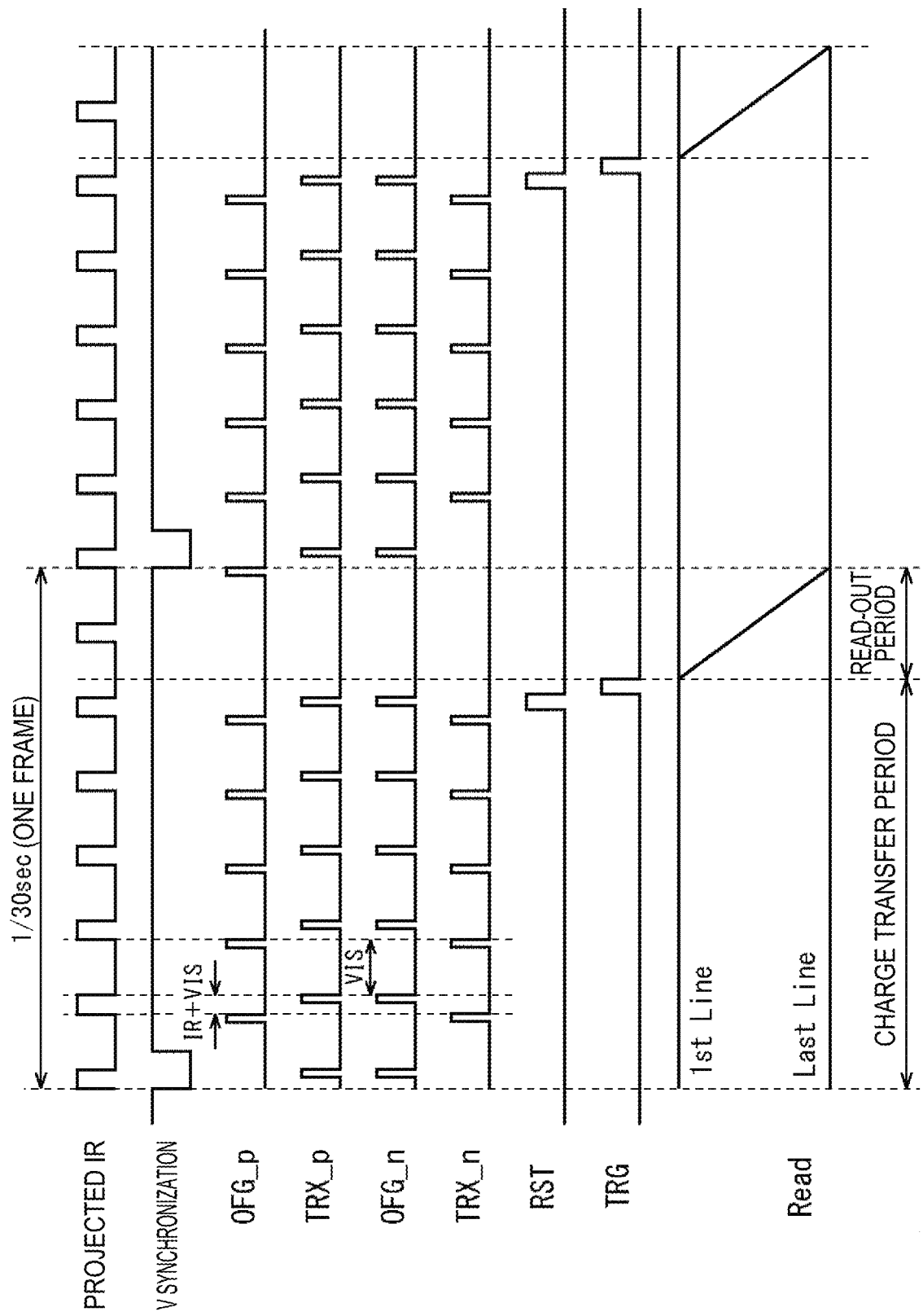
FIG. 13 is a diagram for describing the first modified example of an imaging apparatus.

First, with reference to FIG. 13, the first modified example of the imaging apparatus 10 is described.

In the drive control by the vertical drive circuit 26 having been described with reference to FIG. 6 and FIG. 8, the exposure time of the IR irradiation period and the exposure time of the IR non-irradiation period were set to the same.

However, the camera DSP section 14 can change a duty ratio of an IR irradiation period (ON period) and an IR non-irradiation period (OFF period). Accordingly, as shown in FIG. 13, the duty ratio is controlled such that the IR irradiation period becomes short and the IR non-irradiation period becomes long, whereby it is possible to make an exposure time of the IR irradiation period short and to make an exposure time of the IR non-irradiation period long. For example, in the case of night photography with a surveillance camera, since the sensitivity of an image being not irradiated with projected IR becomes low, it is desirable that an exposure period can be set to be relatively longer. This can be realized by changing a duty ratio of the IR irradiation period and the IR non-irradiation period.

In this connection, according to the use of the imaging apparatus 10, the duty ratio may be controlled such that an IR irradiation period becomes long and an IR non-irradiation period becomes short, and an exposure period of the IR irradiation period may be made long and an exposure period of the IR non-irradiation period may be made short.

Second Modified Example

Next, the second modified example of the imaging apparatus 10 is described.

In the above-mentioned basic embodiment, as made in FIG. 7, all the W pixels were set to a projected IR receiving pixel that receives the visible light of R, G, and B and projected IR. However, as shown in FIG. 14, some of the W pixels can also be set to a projected IR receiving pixel.

Figure 14:
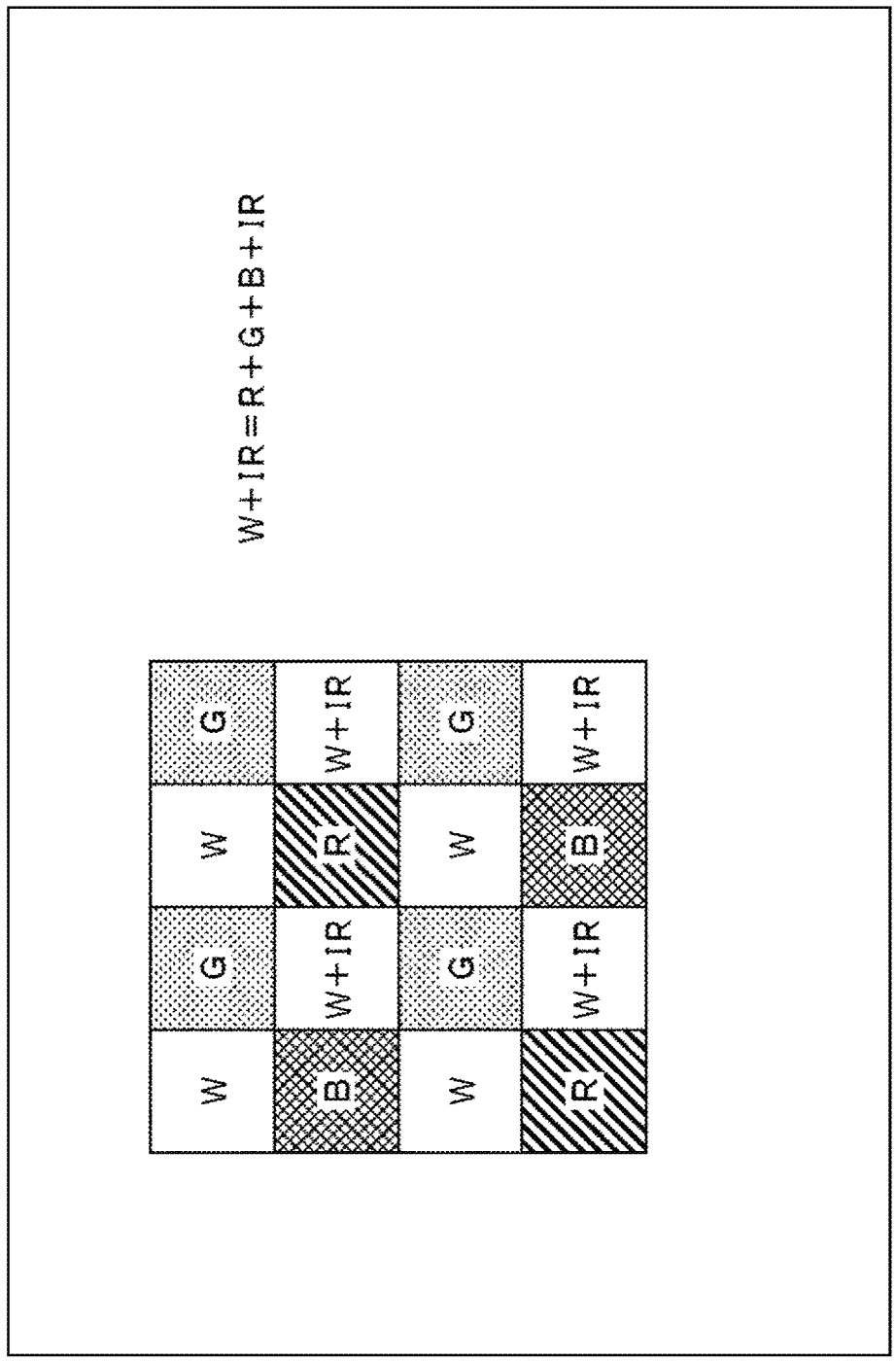
FIG. 14 is a diagram for describing the second modified example of an imaging apparatus.

In an example in FIG. 14, in a row in which a W pixel, a G pixel, a W pixel, a G pixel, . . . are lined up in this order in the horizontal direction, the W pixel is made to be exposed during an IR non-irradiation period, and, receives the visible light of R, G, and B. On the other hand, in a row in which a B pixel, a W pixel, an R pixel, a W pixel, . . . are lined up in this order in the horizontal direction, the W pixel is made to be exposed during an IR irradiation period, and, receives the visible light of R, G, and B and the projected IR.

By controlling the light receiving of each pixel in the pixel array 21 in this way, in the visible image processing system of the camera DSP section 14, it is possible to create a visible image from which environmental IR is separated.

Figure 15:
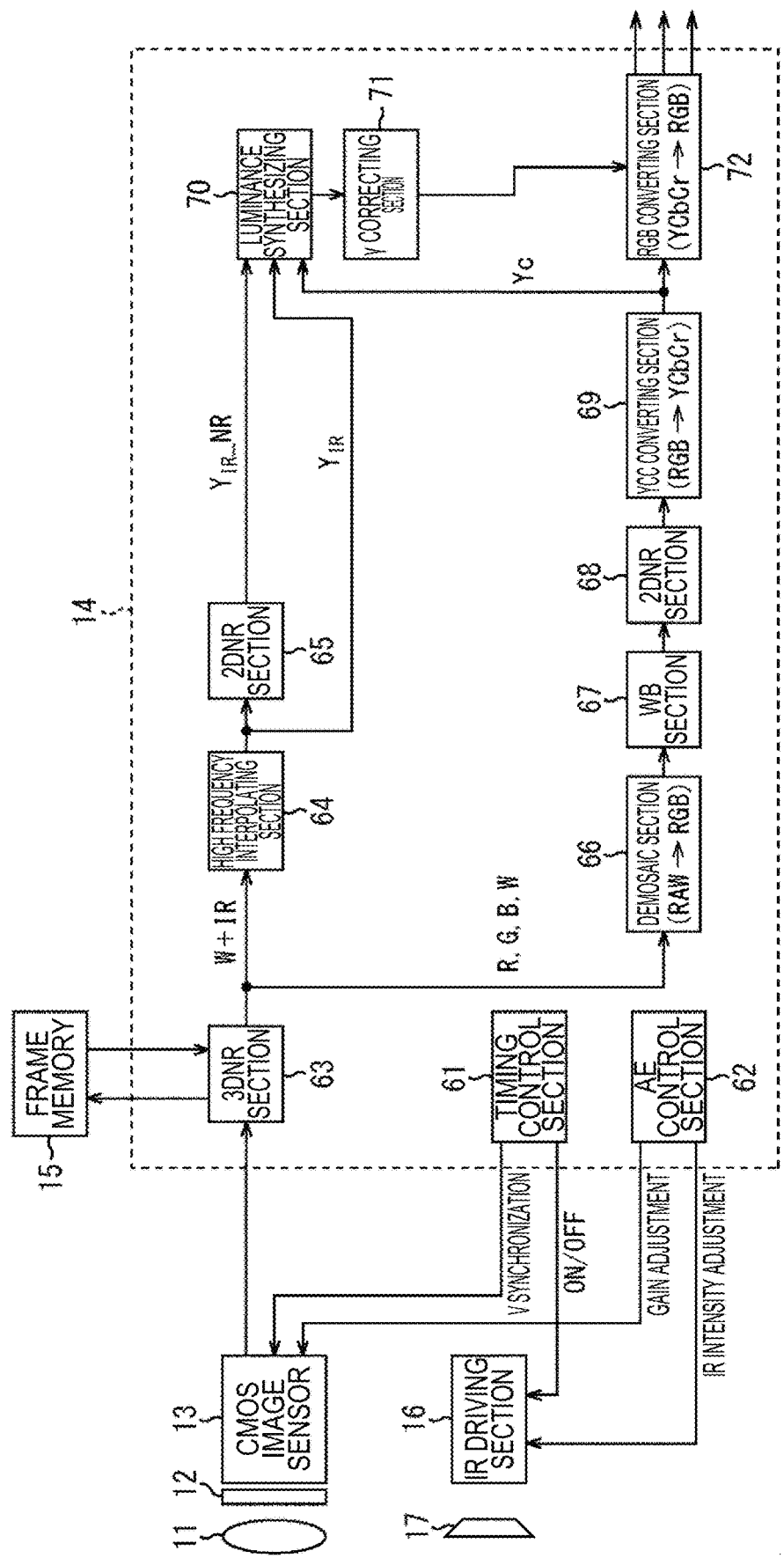
FIG. 15 is a block diagram showing a constitution example of the second modified example of an imaging apparatus.

In concrete terms, as shown in FIG. 14, in the case where some of the W pixels are made pixels to be exposed during an IR irradiation period and the remaining W pixels are made pixels to be exposed during an IR non-irradiation period, as shown in FIG. 15, the signals (W+IR signals) of the W pixels having been exposed during the IR irradiation period are supplied to the high frequency interpolating section 64 of the luminance signal processing system, and the signals (W signals) of the W pixels having been exposed during the IR non-irradiation period are supplied to the demosaic section 66 of the visible image processing system together with the signals (R signals, G signals, and B signals) of the RGB pixels.

Herein, in the case where environmental IR is denoted by ir, and a W signal, an R signal, a G signal, and a B signal each including environmental IR, are denoted respectively by Wir, Rir, Gir, and Bir, a Wir signal, an Rir signal, a Gir signal, and a Bir signal are denoted as Wir=R+G+B+ir, Rir=R+ir, Gir=G+ir, and Bir=B+ir, respectively.

The demosaic section 66 can create an R signal, a B signal, and a G signal from each of which environmental IR is separated, by performing the calculation of the following formulas (1) to (4).

$$ir=(Rir+Gir+Bir-Wir)/2 \quad (1)$$

$$R=Rir-ir \quad (2)$$

$$G=Gir-ir \quad (3)$$

$$B=Bir-ir \quad (4)$$

Therefore, by using the R signal, the B signal, and the G signal from each of which environmental IR is separated, the demosaic section 66 can create a visible image constituted by RGB data in which each pixel has color information of R, G, and B.

In this connection, since some of the W pixels are assigned to pixels which do not receive projected IR, the pixel number of W pixels supplied to the high frequency interpolating section 64 of the luminance signal processing system becomes smaller than that in the basic embodiment, whereby the resolution of an IR irradiation image deteriorates.

Figure 16:
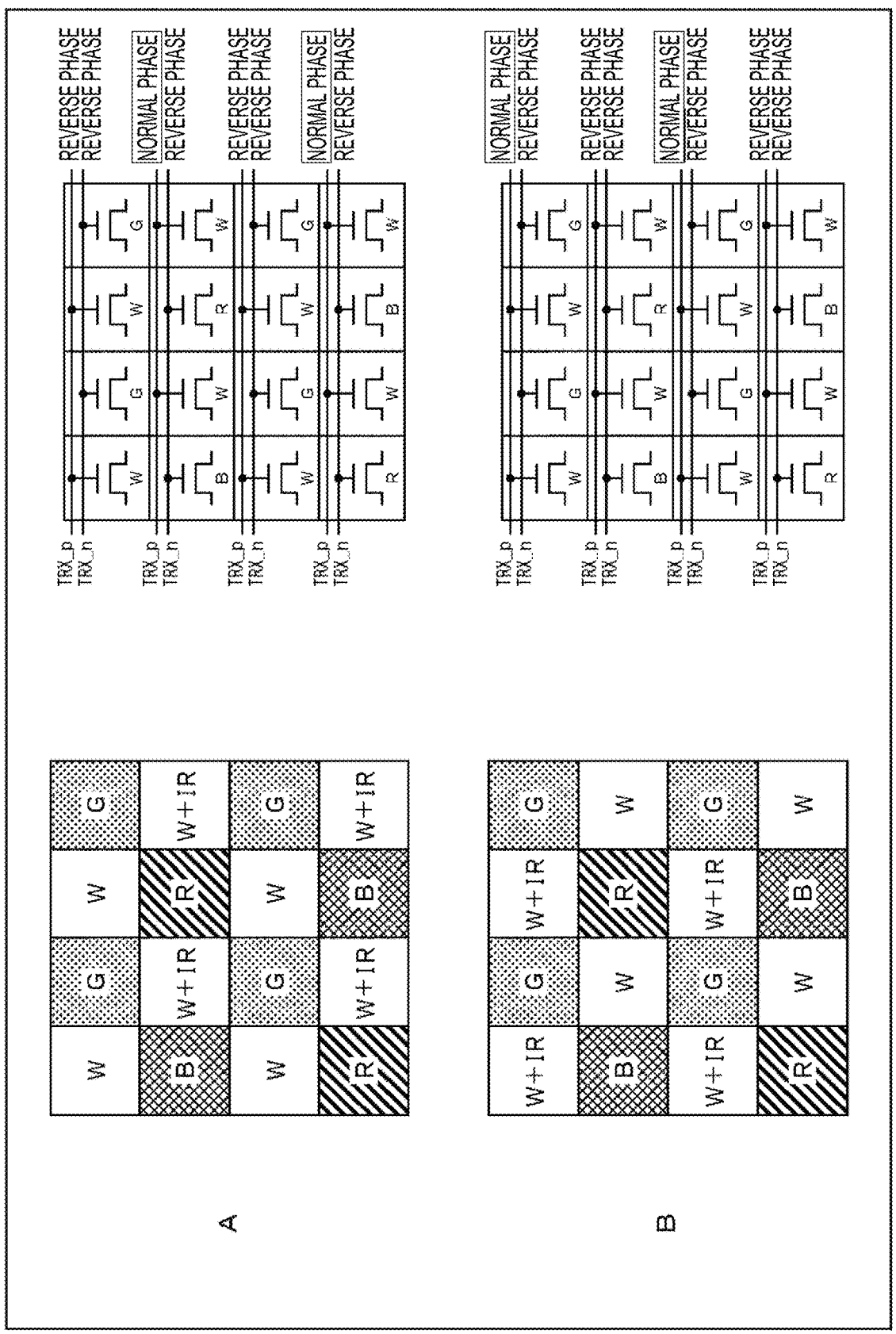
FIG. 16 is an illustration for describing driving in the second modified example of an imaging apparatus.

For this deterioration of the resolution of the IR irradiation image, as shown in FIG. 16, apparent resolution can be raised by, for example, making the W pixels which receive projected IR and the W pixels which do not receive projected IR interchange with each other for each frame.

The CMOS sensor 13 switches over the driving shown in A in FIG. 16 and the driving shown in B in FIG. 16 for each frame. The pixel circuit shown on the right side in A and B in FIG. 16 shows only the first transfer transistor 42 of the pixel 31.

In the case where an operation of exposing and transferring accumulated charges in synchronization with an IR irradiation period is called a normal phase operation and an operation of exposing and transferring accumulated charges in synchronization with an IR non-irradiation period is called a reverse phase operation, A in FIG. 16 shows the driving in which the G pixel and the W pixel on the same row perform the reverse phase operation, and the B pixel and the R pixel and the W pixel on the same row perform the normal phase operation. B in FIG. 16 shows the driving in which the G pixel and the W pixel on the same row perform the normal phase operation, and the B pixel and the R pixel and the W pixel on the same row perform the reverse phase operation.

With regard to deterioration of the resolution due to the assignment of some of the W pixels to the pixels which do not receive projected IR, it is possible to cope with the deterioration with such driving.

In this connection, with regard to the switch-over between the normal phase operation and the reverse phase operation, the switch-over may not be performed for each one frame, but, may be performed for every two frames. That is, a switch-over unit between the normal phase operation and the reverse phase operation may be made a frame unit of one frame period or more.

Moreover, the example in FIG. 16 is an example where a timing at which the pixel 31 in the pixel array 21 performs a charge transfer operation is assigned to any one of a first timing and a second timing (two kinds of timings) in accordance with ON and OFF of projected IR, and, is switched to the other timing for each frame. However, for example, in the case where the kinds of light emission are three kinds or more like R, G, and B, or three kinds of infrared light wavelengths, which are mentioned later, a timing at which the pixel 31 in the pixel array 21 performs a charge transfer operation is assigned to any one of three or more kinds of timings, and the operation can be made to switch over the timing to the other timing sequentially in unit of frames of one frame period or more.

Third Modified Example

Next, the other driving method of the pixel array 21 as the third modified example of the imaging apparatus 10 is described.

In the above-mentioned example, the driving is made such that all or some of the W pixels are made the projected IR receiving pixels and the RGB pixels become visible light receiving pixels. However, depending on the scene environment and intended use, it is also possible to make all the pixels to the projected IR receiving pixels as shown in A in FIG. 17, or to make all the pixels operate as the visible light receiving pixels as shown in B in FIG. 17.

For example, the imaging apparatus 10 can make the all the pixels in the pixel array 21 to the projected IR receiving pixels on a scene with weak visible light, and, make all the pixels operate as the visible light receiving pixels under the environment with sufficient visible light. The two kinds of driving shown in FIG. 17 and the driving in the basic embodiment are switched over, for example, by the operation mode of the imaging apparatus 10.

Fourth Modified Example

Figure 18:
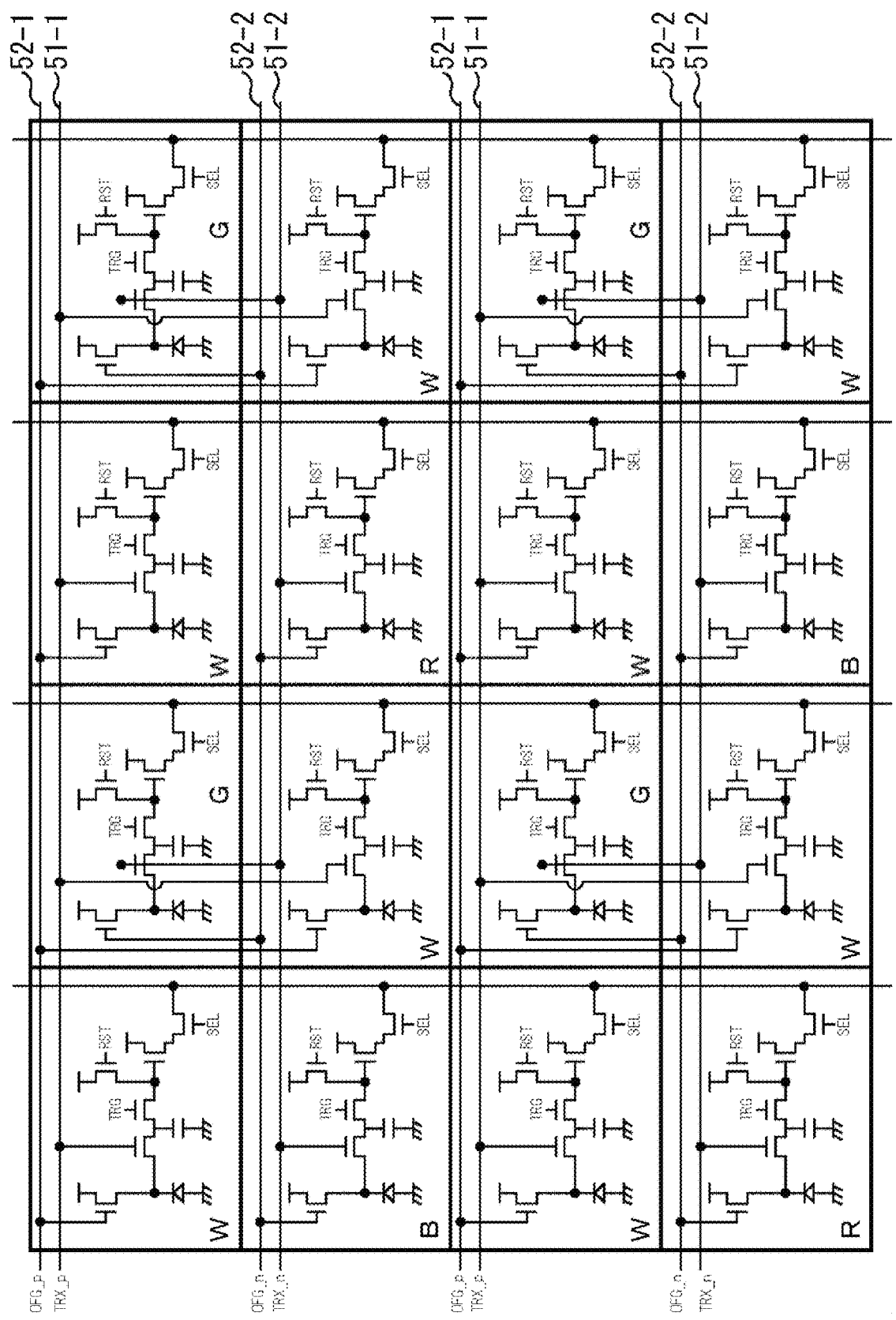
FIG. 18 is a diagram for describing the fourth modified example of an imaging apparatus.

FIG. 18 shows the other drive control wiring example of the pixel array 21 as the fourth modified example of the imaging apparatus 10.

In the drive control wiring example of the basic embodiment shown in FIG. 5, the two TRX control lines 51 of the TRX control lines 51-1 and 51-2 are arranged for one row of the pixel array 21. Moreover, also with regard to the OFG control line 52, the two OFG control lines 52 of the OFG control lines 52-1 and 52-2 are arranged for one row of the pixel array 21.

On the other contrary, in the drive control wiring example shown in FIG. 18, with regard to the TRX control line 51, one TRX control line 51 is arranged for one row in the pixel array 21. In more details, a TRX control line 51-1 to transmit a transfer signal TRX_p is arranged for one row of two adjacent rows, and a TRX control line 51-2 to transmit a transfer signal TRX_n is arranged for the other row.

Also, with regard to the OFG control line 52, similarly, one OFG control line 52 is arranged for one row in the pixel array 21. In more details, an OFG control line 52-1 to transmit a discharge signal OFG_p is arranged for one row of two adjacent rows, and an OFG control line 52-2 to transmit a discharge signal OFG_n is arranged for the other row.

The transfer signal TRX_p is supplied in common to the first transfer transistor 42 of each of the W pixels on the two adjacent rows via the TRX control line 51-1, and the transfer signal TRX_n is supplied in common to the first transfer transistor 42 of each of the RGB pixels on the two adjacent rows via the TRX control line 51-2. Also, with regard to the discharge transistor 49, similarly, the discharge signal OFG_p is supplied in common to the discharge transistor 49 of each of the W pixels on the two adjacent rows via the OFG control line 52-1, and the discharge signal OFG_n is supplied in common to the discharge transistor 49 of each of the RGB pixels on the two adjacent rows via the OFG control line 52-2.

In this connection, in this drive control wiring example, each of the W pixel and the RGB pixels performs the normal phase operation synchronizing with the IR irradiation period or the reverse phase operation synchronizing with the IR non-irradiation period in units of two rows. Accordingly, it is impossible to perform the driving to make the normal phase operation and the reverse phase operation interchange with each other for each row as shown FIG. 14 and FIG. 16. However, it is possible to suppress the number of wirings per one row. In the case where it is desired to divide the respective W pixels in the pixel array 21 into projected IR receiving pixels and visible light receiving pixels, for example, it is possible to set the projected IR receiving pixels and the visible light receiving pixels in units of two rows.

Fifth Modified Example

Next, the fifth modified example of the imaging apparatus 10 is described.

in the above-mentioned basic embodiment, the description has been given for a case where the filter arrangement in the pixel array 21 is a RGBW filter composed of W filters arranged in a checkered pattern and R, G, and B filters as shown in FIG. 4.

Figure 19:
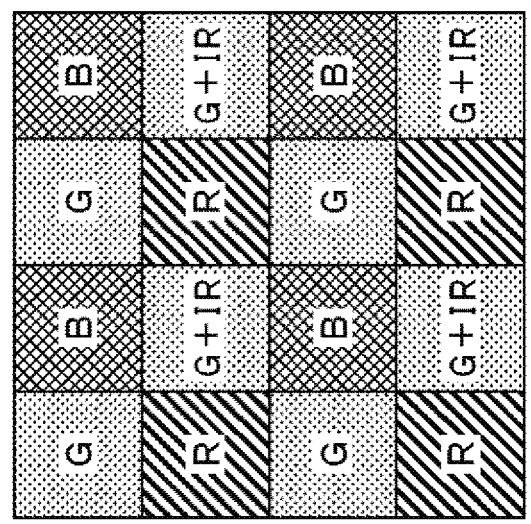
FIG. 19 is an illustration for describing the fifth modified example of an imaging apparatus.

As the filter arrangement in the pixel array 21, without being limited to the RGBW filter, for example, it is also possible to adopt a Bayer arrangement in which a combination of R, G, B, and G is repeatedly arranged. In the case where the filter arrangement is made a Bayer arrangement, as shown in FIG. 19, it is possible to constitute such that among four pixels of two pixels×two pixels of a G pixel, a B pixel, an R pixel, and a G pixel serving as a repeating unit, one G pixel is assigned to a projected IR receiving pixel, and the other one G pixel is assigned to a visible light receiving pixel. In an example in FIG. 19, in a row in which a G pixel, a B pixel, a G pixel, a B pixel, . . . are lined up in this order in the horizontal direction, the G pixel is exposed during an IR non-irradiation period, and, receives wavelength light of G. On the other hand, in a row in which a R pixel, a G pixel, a R pixel, a G pixel, . . . are lined up in this order in the horizontal direction, the G pixel is exposed during an IR irradiation period, and, receives wavelength light of G and projected IR.

Figure 20:
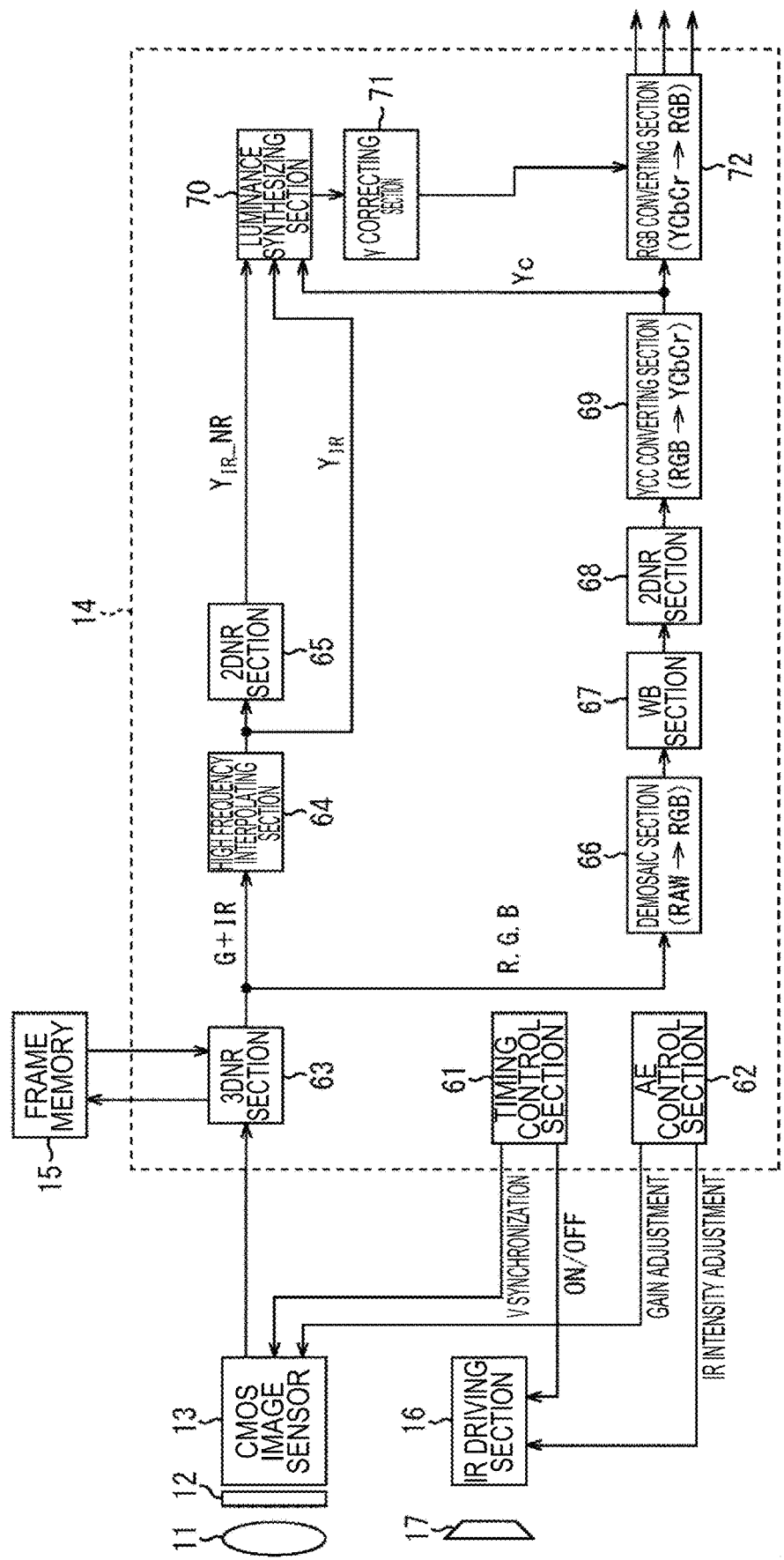
FIG. 20 is a block diagram showing a constitution example of the fifth modified example.

In this case, as shown in FIG. 20, the signals (G+IR signals) of the G pixel exposed during the IR irradiation period are supplied to the high frequency interpolating section 64 of the luminance signal processing system, and the signals (G signals, R signals, B signals) of the G pixel, the R pixel, and the B pixel each exposed during the IR non-irradiation period, are supplied to the demosaic section 66 of the visible image processing system.

Since the operation of each block of the luminance signal processing system and the visible image processing system in the camera DSP section 14 is the same as that in the above-mentioned basic embodiment, description for it is omitted.

In this connection, similarly to the case, having been described with reference to FIG. 14, where some of the W pixels is assigned to the projected IR receiving pixels, since the pixel number of G pixels assigned to the projected IR receiving pixels becomes smaller than that in the basic embodiment, the resolution of an IR irradiation image deteriorates. Also, for this degradation of the resolution, as having described in FIG. 16, apparent resolution can be raised by interchanging a row that performs a normal phase operation and a row that performs a reverse phase operation for the G pixel alternately in units of a frame.

Figure 17:
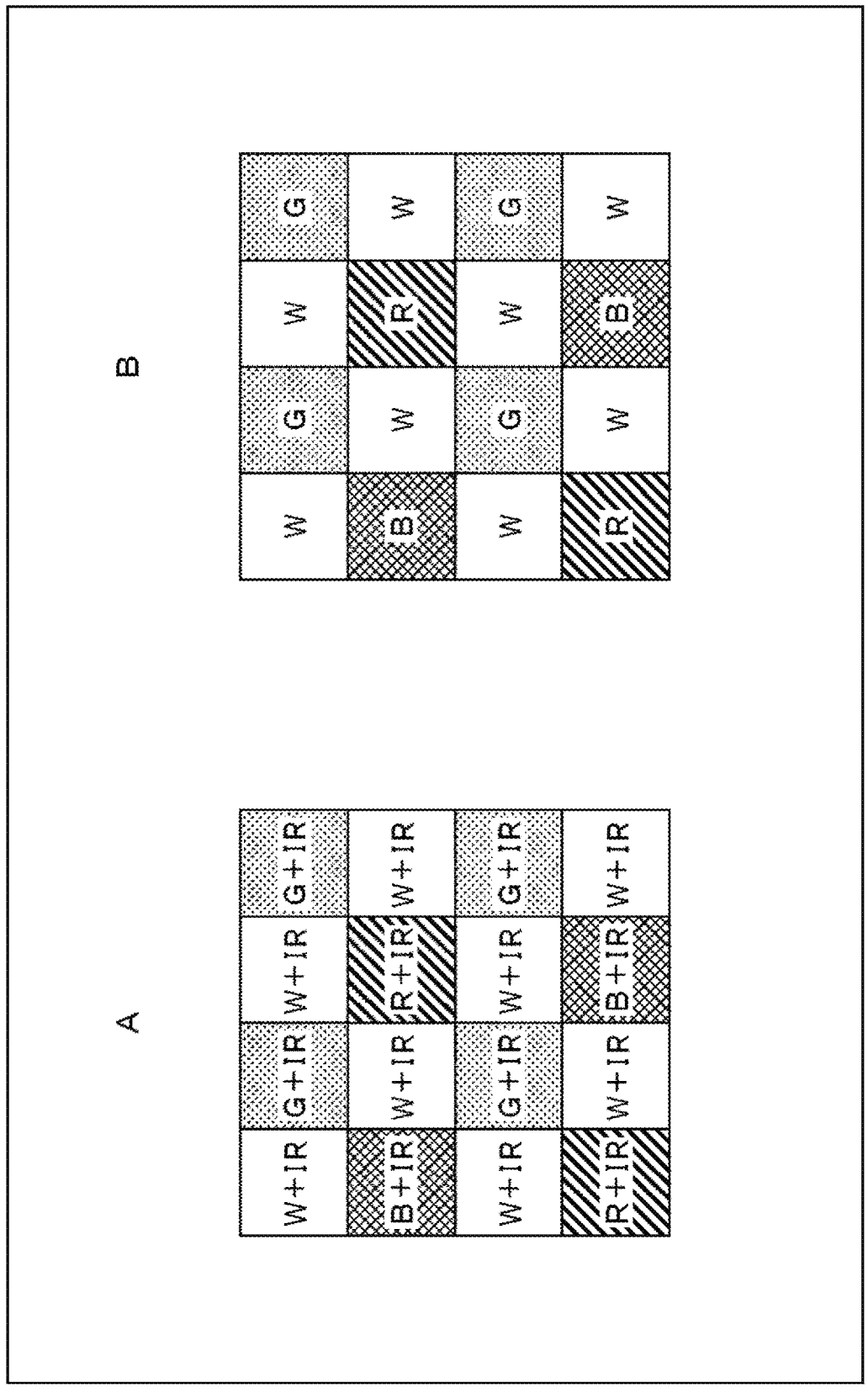
FIG. 17 is an illustration for describing the third modified example of an imaging apparatus.

Moreover, also in the case where the filter arrangement in the pixel array 21 is a Bayer arrangement, similarly to the case of the RGBW filter having been described in FIG. 17, it is possible to make all the pixels in the pixel array 21 operate as a projected IR receiving pixel, or to make them operate as a visible light receiving pixel.

Sixth Modified Example

Next, the sixth modified example of the imaging apparatus 10 is described.

In the above-mentioned basic embodiment, the W pixels were set to the projected IR receiving pixels and the RGB pixels were set to the visible light receiving pixels. However, each of the pixels 31 in the pixel array 21 can be driven such that each of the W pixels, the R pixels, the G pixels, and the B pixels includes a projected IR receiving pixel and a visible light receiving pixel.

Figure 21:
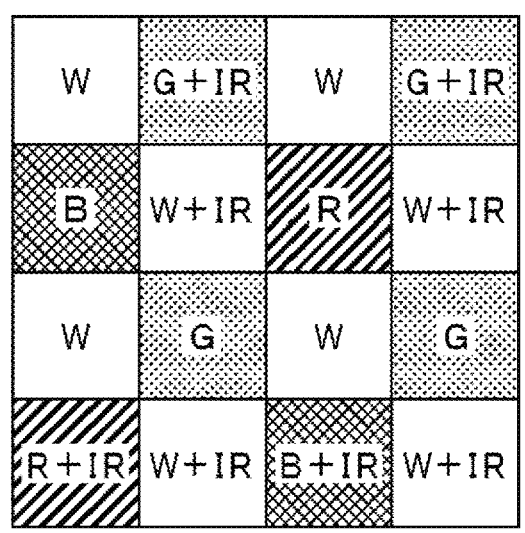
FIG. 21 is an illustration for describing the sixth modified example of an imaging apparatus.

For example, the imaging apparatus 10 can set a projected IR receiving pixel and a visible light receiving pixel for each of the W pixels, the R pixels, the G pixels, and the B pixels, as shown in FIG. 21.

In FIG. 21, for a region of sixteen pixels of 4 pixels×4 pixels, among two rows in each of which a W pixel, a G pixel, a W pixel, and a G pixel are lined up in this order, the two G pixels on one of the two rows are set to a projected IR receiving pixel, and the two G pixels on the other one row are set to a visible light receiving pixel. Moreover, with regard to the W pixels on these two rows, all are set to a visible light receiving pixel.

Moreover, in a region of sixteen pixels of 4 pixels×4 pixels shown in FIG. 21, among two rows in each of which one B pixel, one R pixel, and two W pixels are lined up, the B pixel and the R pixel on one row of the two rows are set to a projected IR receiving pixel, and the B pixel and the R pixel on the other one row are set to a visible light receiving pixel. Moreover, with regard to the W pixels on these two rows, all are set to a projected IR receiving pixel.

In this way, by setting a projected IR receiving pixel and a visible light receiving pixel in synchronization with an IR irradiation period or an IR non-irradiation period, in a region of sixteen pixels of 4 pixels×4 pixels, four IR signals can be acquired for the W pixels, two IR signals can be acquired for the G pixels, and one IR signal can be acquired for the R pixel and the B pixel.

Other Constitution Example of Camera DSP Section

Figure 22:
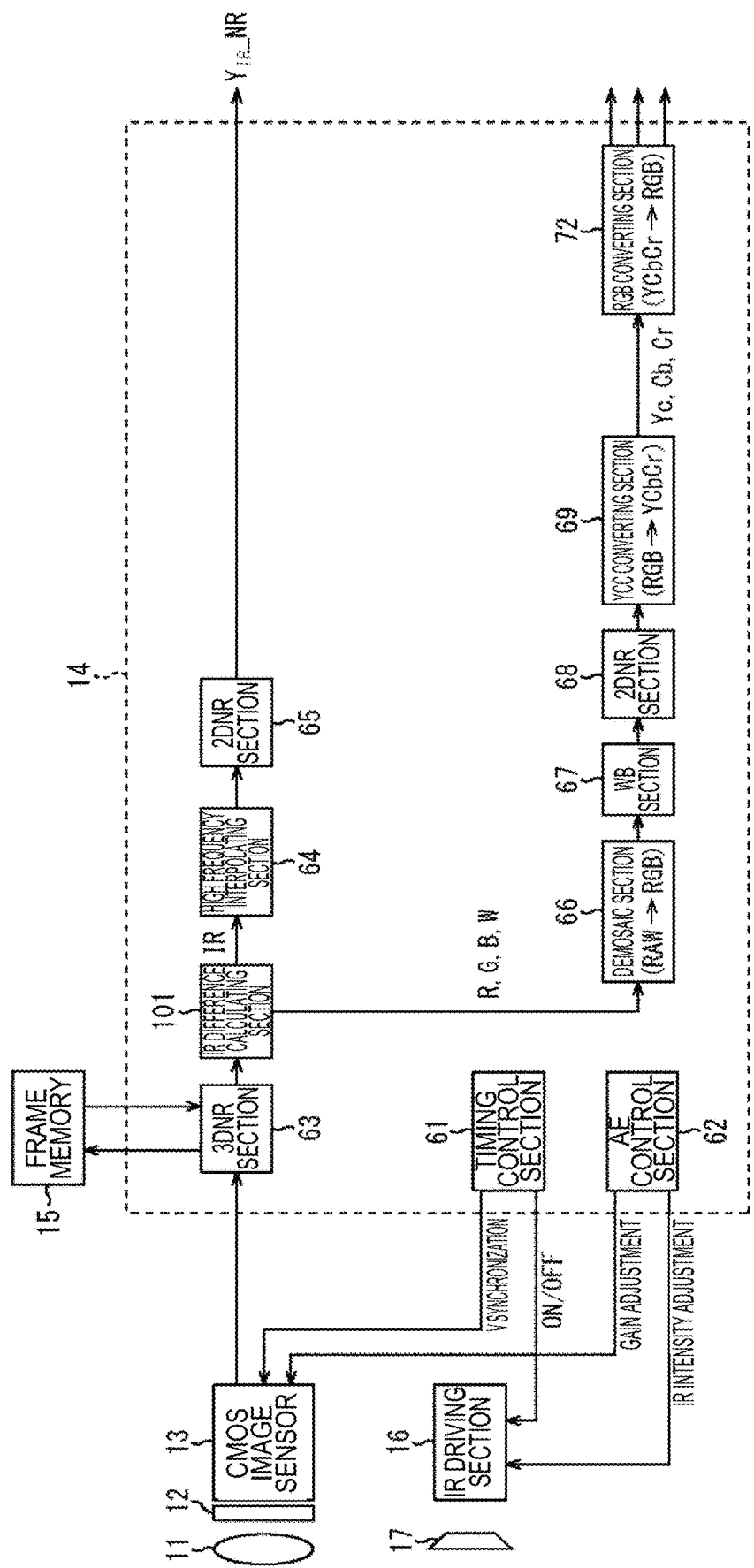
FIG. 22 is a block diagram showing the second constitution example of a camera DSP section.

As shown in FIG. 21, in the case where each of the pixels 31 is driven such that each of the W pixels, the R pixels, the G pixels, and the B pixels in the pixel array 21 includes a projected IR receiving pixel and a visible light receiving pixel, the camera DSP section 14 can be constituted as shown in FIG. 22.

That is, FIG. 22 shows a constitution example (the second constitution example) of the camera DSP section 14 in the case where each of the W pixels, the R pixels, the G pixels, and the B pixels in the pixel array 21 includes a projected IR receiving pixel and a visible light receiving pixel.

In the case of comparing the constitution of the camera DSP section 14 shown in FIG. 22 with the constitution of the camera DSP section 14 shown in FIG. 9, in FIG. 22, an IR difference calculating section 101 is newly disposed at the latter stage of the 3DNR section 63, and, in addition, the luminance synthesizing section 70 and the γ correcting section 71 are omitted.

The IR difference calculating section 101 performs signal processing so as to subtract the signals of the visible light receiving pixels from the signals of the projected IR receiving pixels for each of the W pixels, the R pixels, the G pixels, and the B pixels, calculates the IR signals of the projected IR, and supplies to the high frequency interpolating section 64. That is, the IR difference calculating section 101 performs the calculation of the following formulas (5) to (8) for each of the W pixels, the R pixels, the G pixels, and the B pixels.

$$IR=(W+IR)-W \quad (5)$$

$$IR=(R+IR)-R \quad (6)$$

$$IR=(G+IR)-G \quad (7)$$

$$IR=(B+IR)-B \quad (8)$$

Moreover, for the projected IR receiving pixels, the IR difference calculating section 101 performs the calculation of the following formulas (9) to (12) that subtracts IR signals calculated by the formulas (5) to (8), and, supplies the signals after the calculation to the demosaic section 66. On the other hand, for the visible light receiving pixels, the IR difference calculating section 101 supplies the signals of each of the pixels as it is to the demosaic section 66.

$$W=(W+IR)-IR \quad (9)$$

$$R=(R+IR)-IR \quad (10)$$

$$G=(G+IR)-IR \quad (11)$$

$$B=(B+IR)-IR \quad (12)$$

Figure 23:
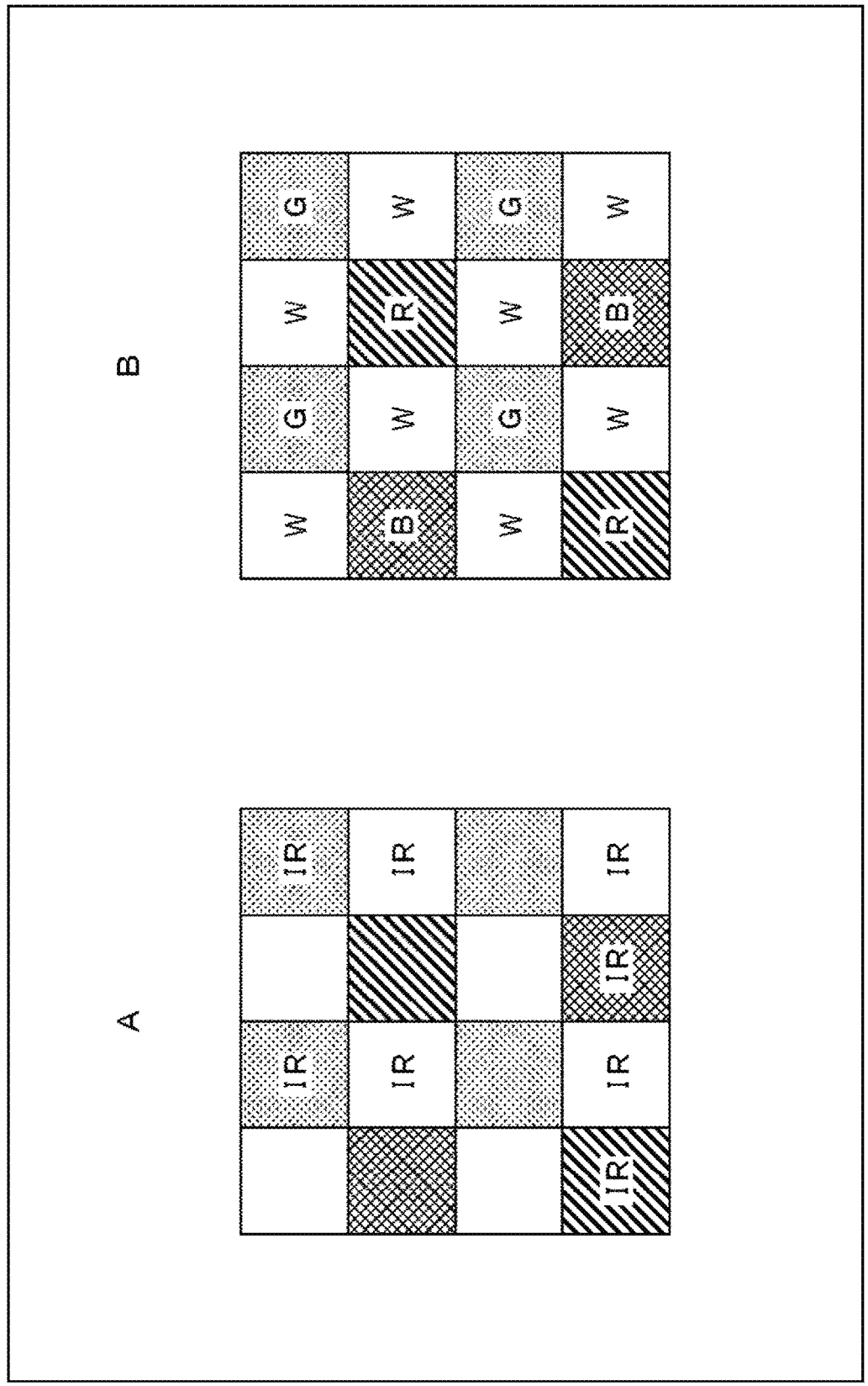
FIG. 23 is an illustration for describing signals output by a high frequency interpolating section in the sixth modified example.

A in FIG. 23 shows the signals output from the IR difference calculating section 101 to the high frequency interpolating section 64 in the region of sixteen pixels of 4 pixels×4 pixels in the pixel array 21. In A in FIG. 23, the pixels written as "IR" are pixels that output an IR signal, and the other pixels are pixels that do not output an IR signal.

B in FIG. 23 shows the signals output from the IR difference calculating section 101 to the demosaic section 66 in the region of sixteen pixels of 4 pixels×4 pixels in the pixel array 21. In B in FIG. 23, pixels written as "R", "G", "B", and "W" are pixels that output an R signal, a G signal, a B signal, and a W signal, respectively.

The high frequency interpolating section 64 calculates IR signal of pixels that do not have an output of an IR signal, from the IR signals supplied from the IR difference calculating section 101 by interpolation processing, and, creates an IR irradiation image in which the pixel data of each pixel are constituted by the luminance information $Y_{IR}$.

The 2DNR section 65 performs two-dimensional noise reduction processing for the luminance information $Y_{IR}$ of each pixel of an IR irradiation image, thereby extracting its low frequency component, and, makes luminance information $Y_{IR\_NR}$ acquired as a result of it the output of the camera DSP section 14.

The visible image processing system on and after the demosaic section 66 creates a visible image constituted by RGB data in which each pixel has color information of R, G, and B, from the respective signals (G signals, R signals, B signals, and W signals) of the G pixels, the R pixels, the B pixels, and the W pixels supplied from the IR difference calculating section 101, and makes it the output of the camera DSP section 14. The camera DSP section 14 may make the RGB data output by the RGB converting section 72 an output of the camera DSP section 14, or, may make the YCC data output by the YCC converting section 69 an output of the camera DSP section 14.

According to the sixth modified example of the imaging apparatus 10, the driving is made such that each of the W pixel, the R pixel, the G pixel, and the B pixel includes a projected IR receiving pixel and a visible light receiving pixel, whereby it is possible to output both an IR irradiation image by projected IR and a visible image (color image).

Moreover, according to the sixth modified example, similarly to the second modified example of the imaging apparatus 10 having been explained in FIG. 15, the R signals, the G signals, the B signals, and the W signals are supplied to the demosaic section 66. Accordingly, by performing the calculation of the above-mentioned formulas (1) to (4), it is possible to create an R signal, a B signal, and a G signal from each of which environmental IR is separated.

The constitution of the imaging apparatus 10 of the sixth modified example is useful in the case where it is desired to create an image (IR irradiation image) only by projected IR, such as a distance measurement sensor and an iris attestation sensor. According to this constitution, it is possible to acquire also a visible image simultaneously in addition to an IR irradiation image.

By the way, in the arrangement of the projected IR receiving pixels and the visible light receiving pixels shown in FIG. 21, deflection is observed in the pixel positions that output IR signals, as shown in A in FIG. 23. Then, as having described with reference to FIG. 16, apparent resolution can be raised by interchanging a pixel that performs a normal phase operation and a pixel that performs a reverse phase operation alternately for each frame.

Figure 24:
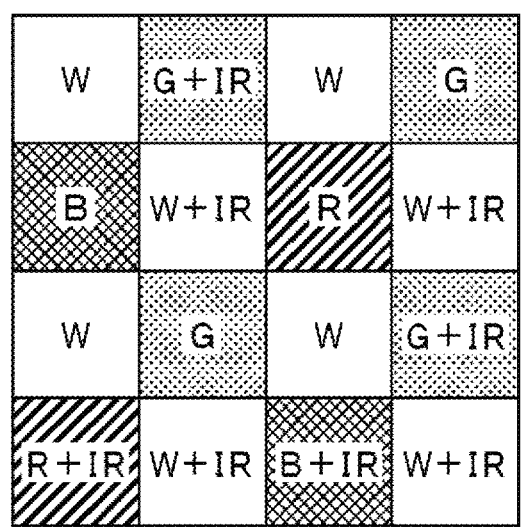
FIG. 24 is an illustration for describing the other example of pixel driving in the sixth modified example.

The wiring example of the drive control line that controls the pixel transistor of each pixel 31 is not limited to the wiring examples shown in FIG. 5 and FIG. 18. For example, the wiring may be made so as to control each pixel of the pixel array 21 individually, alternatively, for example, may be made so as to control only predetermined color pixels (for example, G pixels) of R, G, B, and W pixels in units of a pixel. For example, in the case where a normal phase operation and a reverse phase operation can be controlled in units of a pixel for each of G pixels on the same row, as shown in FIG. 24, adjacent G pixels on one row are assigned alternately to a projected IR receiving pixel and a visible light receiving pixel, whereby projected IR receiving pixels and visible light receiving pixels can be arranged equally in any of W pixels, R pixels, G pixels, and B pixels for each region of sixteen pixels of 4 pixels×4 pixels in the pixel array 21.

The filter arrangement in a constitution to output both an IR irradiation image and a visible image in the sixth modified example of the imaging apparatus 10 is not limited to the RGBW filter. For example, also in the case where the filter arrangement is a Bayer arrangement or a RGB-IR filter, both an IR irradiation image and a visible image can be output simultaneously.

Figure 25:
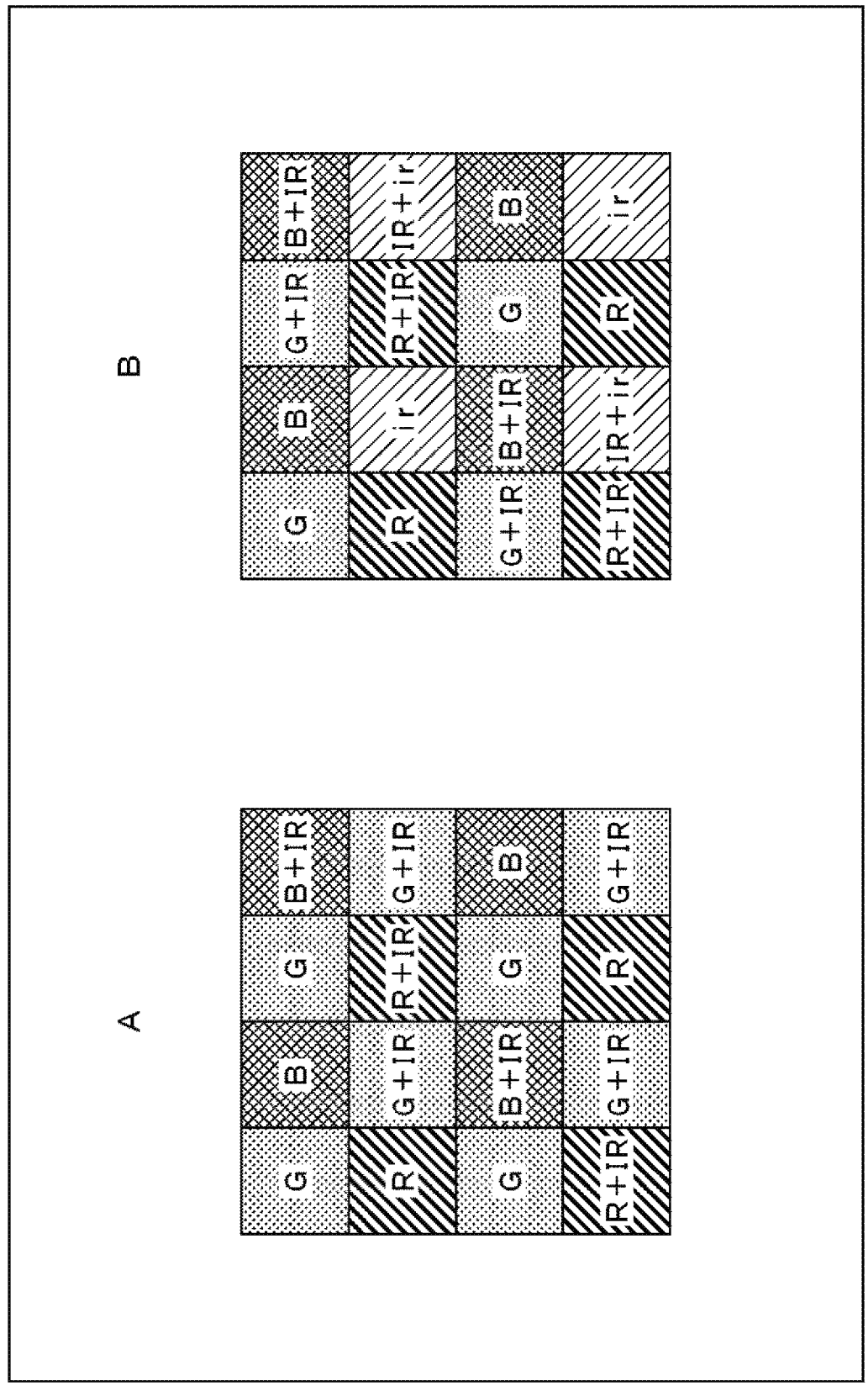
FIG. 25 is an illustration for describing further the other example of pixel driving in the sixth modified example.

A in FIG. 25 shows an assignment example of projected IR receiving pixels and visible light receiving pixels in a region of sixteen pixels of 4 pixels×4 pixels in the pixel array 21 in the case where a filter arrangement is made a Bayer arrangement.

B in FIG. 25 shows an assignment example of projected IR receiving pixels and visible light receiving pixels in a region of sixteen pixels of 4 pixels×4 pixels in the pixel array 21 in the case where a filter arrangement is made an RGB-IR filter.

The RGB-IR filter is a filter arrangement in which one G filter in the filter arrangement of G, B, R, and G serving as a repeating unit in a Bayer arrangement is replaced with an infrared filter that allows only a wavelength region of infrared light to pass through.

In the filter arrangement of the RGB-IR filter, an infrared filter pixel set to a projected IR receiving pixel receives both projected IR and environmental IR (in B in FIG. 25, illustrated as "IR+ir"), and an infrared filter pixel set to a visible light receiving pixel receives only environmental IR (in B in FIG. 25, illustrated as "ir").

In this connection, similarly to the case of FIG. 24, each of A and B in FIG. 25 shows an assignment example of projected IR receiving pixels and visible light receiving pixels in the case where projected IR receiving pixels and visible light receiving pixels are arranged equally for each pixel having the same filter.

Seventh Modified Example

Next, the seventh modified example of the imaging apparatus 10 is described.

The seventh modified example of the imaging apparatus 10 is the other example of a method of reading out charges accumulated in each pixel 31 in the pixel array 21.

In the above-mentioned basic embodiment, the method of reading out accumulated charges is a global shutter read-out method in which, as having described with reference to FIG. 8 etc., one frame period is divided into a charge transfer period and a read-out period, and after the charge transfer period, all the pixels are read out simultaneously. However, the imaging apparatus 10 can also read out the accumulated charges of each pixel 31 in the pixel array 21 with a focal plane read-out method in which a charge transfer operation and a read-out operation are performed at a timing shifted by a predetermined time for each row.

Figure 26:
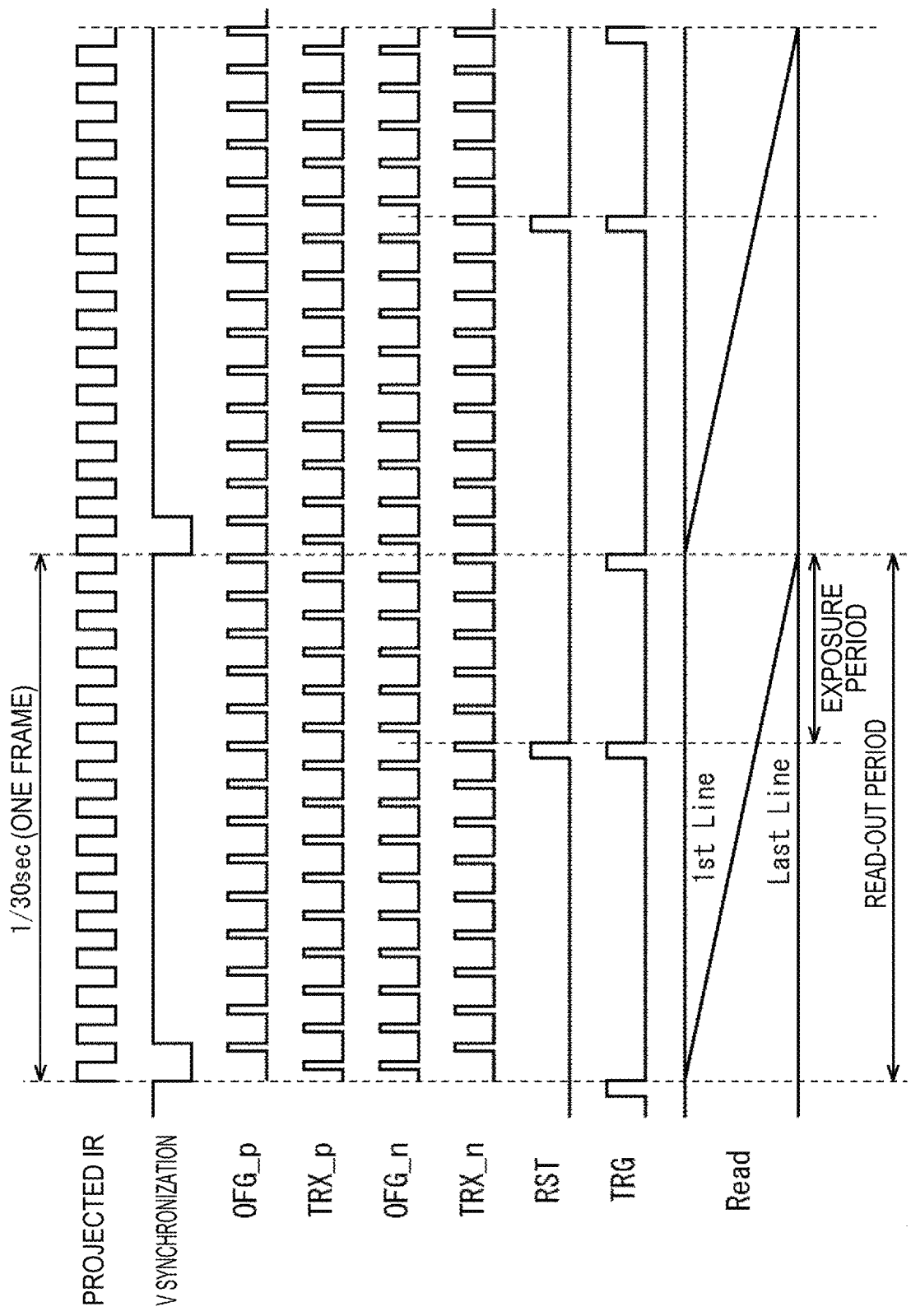
FIG. 26 is a diagram for describing the seventh modified example of an imaging apparatus.

FIG. 26 is a timing chart showing a method of reading out accumulated charges by the focal plane read-out method.

In the focal plane read-out method, the electric potential of the memory section 43 and the FD 45 is reset by turning the reset transistor 46 and the second transfer transistor 44 ON simultaneously. An exposure period is from when the reset transistor 46 and the second transfer transistor 44 are turned OFF simultaneously until the second transfer transistor 44 is turned ON again and the accumulated charges in the memory section 43 is transferred to the FD45. A length of the exposure period is the same for all the pixels in the pixel array 21. However, a timing when the exposure period is started (namely, a timing when the electric potential of the memory section 43 and the FD 45 is reset simultaneous) is different for each row in the pixel array 21. Therefore, in this read-out method, focal plane distortion occurs. However, in uses where some distortion does not cause problems (for example, uses for surveillance), it is possible to apply the focal plane read-out method.

In the focal plane read-out method, as shown in FIG. 26, a read-out period can be made one frame period. Accordingly, it is possible to secure an AD conversion period for a long time during which pixel signals are subjected to AD conversion in the ADC 24 by being compared with reference signals in which a voltage changes stepwise, and the bit number of A/D conversion can be made a large value (for example, 12 bits). With this, it is possible to increase the accuracy in reading out pixel signals.

10. Application Example of Other Applications

As having described in the above, the imaging apparatus 10 to which the present technology is applied, for example, divides all the pixels in the pixel array 21 into projected IR receiving pixels that receive light at a timing (IR irradiation period) when projected IR has been irradiated and visible light receiving pixels that receive light at a timing (IR non-irradiation period) when projected IR is not irradiated, and, creates a color image in which contrast has become vivid, by synthesizing an IR irradiation image created from the pixel signals of the projected IR receiving pixels and a visible image (IR non-irradiated image) created from the pixel signals of the visible light receiving pixels.

In the above-mentioned example, all the pixels in the pixel array 21 are divided by ON and OFF of the irradiation of projected IR. However, it is possible to adopt a mode of dividing by the other conditions and acquiring pixel signals corresponding to each of the conditions.

Figure 27:
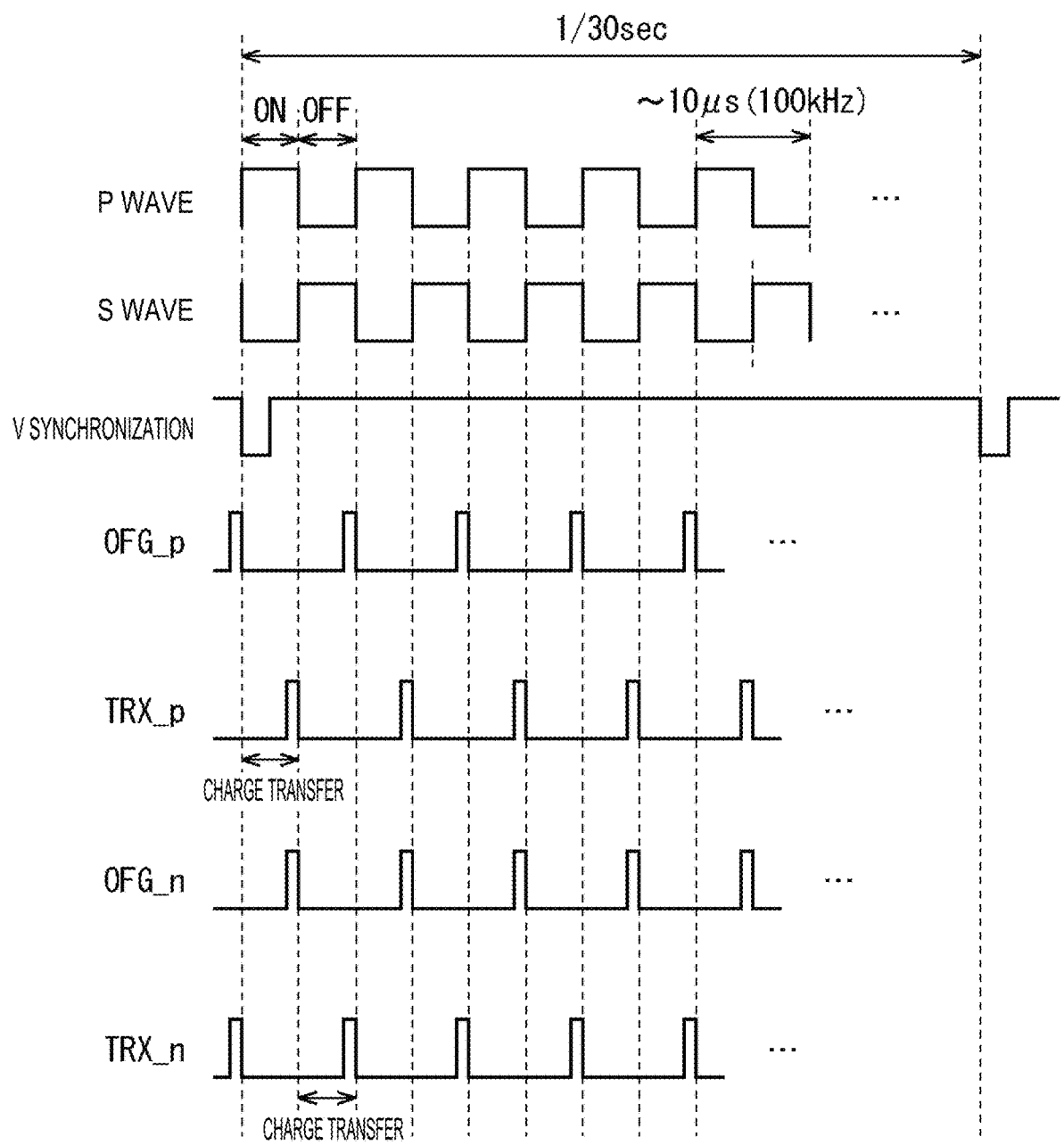
FIG. 27 is a diagram for describing an application example of the other application.

For example, as shown in FIG. 27, the mode can be made so as to irradiate time-divisionally two kinds of light of P waves and S wave different in the polarization direction, to divide all the pixels in the pixel array 21 into two types correspondingly to two types of light emitting timings, and to receive light in synchronization with the irradiating timing of each polarized light.

Moreover, in recent years, signal machines (traffic signal machines) on the road are replaces with those having used LED light sources. The LED light source is a pulse light source (alternating-current light source) that repeats lighting on and lighting off at a prescribed period. In in-vehicle cameras, such as a drive recorder, etc., in the case of viewing a recorded moving image, a signal machine that is viewed as being lighting on with human eyes, is often recorded to appear as being blinking (flicker). This is because, in the case where the imaging timing of an in-vehicle camera coincides with the time of lighting off of a LED light source, it is recorded to appear as being lighting off.

By separating all the pixels of the pixel array 21 into pixels that receive light at a first timing and pixels that receive light at a second timing, and, synthesizing pixel signals of them, an exposure period during which exposing is performed at a light emission timing of a LED light source, becomes to be necessarily included, and it is possible to prevent the flicker phenomena of an imaged image.

Moreover, in light emission of a headlight of a car, there is a light distribution pattern of light so-called high beam and low beam. The light distribution pattern means at least one or both of the radiation direction or radiation area of light. Moreover, in recent years, how to irradiate a headlight by a light distribution pattern other than the high beam and the low beam has been also studied.

Figure 28:
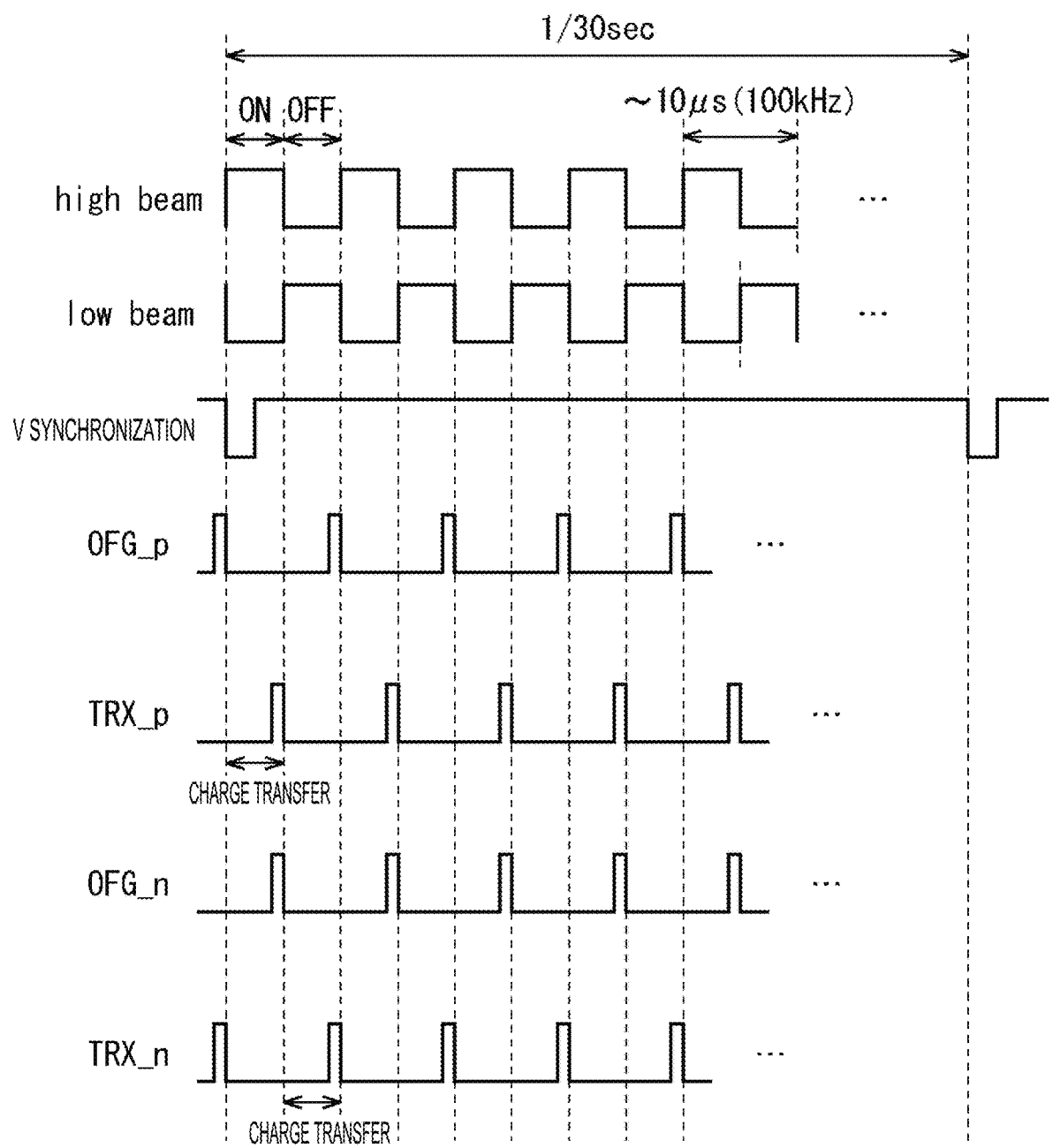
FIG. 28 is a diagram for describing an application example of the other application.

As shown in FIG. 28, it is possible to separate all the pixels in the pixel array 21 into two kinds in accordance with a light distribution pattern like a high beam and a low beam, and to control to receive light in synchronization with an irradiation timing of each light distribution pattern.

Alternatively, it is also possible to irradiate time-divisionally three kinds (two or more kinds) of infrared light with different wavelengths of 780 nm, 870 nm, and 940 nm, to separate all the pixels in the pixel array 21 into three kinds corresponding to the three kinds of respective wavelengths, and to control to receive light in synchronization with an irradiation timing of infrared light of each of the wavelengths.

Moreover, it may be made to irradiate time-divisionally light of three kinds of wavelengths of visible light, for example, like R, G, and B, not to divide infrared light into three kinds of wavelengths, to separate all the pixels in the pixel array 21 into three kinds corresponding to the three kinds of respective wavelengths, and to control to receive light in synchronization with an irradiation timing of visible light of each of the wavelengths.

A series of processes described above can be executed by hardware or software. When a series of processes is executed by software, a program constituting the software is installed in a computer. Here, examples of the computer include a computer incorporated in dedicated hardware and a general-purpose personal computer which is capable of executing various kinds of functions when various kinds of programs are installed therein.

FIG. 29 is a block diagram illustrating an exemplary hardware configuration of a computer that executes a series of processing described above by a program.

In this computer 200, a central processing unit (CPU) 201, a read only memory (ROM) 202, and a random access memory (RAM) 203 are connected to one another by a bus 204.

An input/output interface 205 is further connected to the bus 204. An input unit 206, an output unit 207, a storage unit 208, a communication unit 209, and a drive 210 are connected to the input/output interface 205.

The input unit 206 includes a keyboard, a mouse, a microphone, or the like. The output unit 207 includes a display, a speaker, or the like. The storage unit 208 includes a hard disk, a nonvolatile memory, or the like. The communication unit 209 includes a network interface or the like. The drive 210 drives a removable medium 911 such as a magnetic disk, an optical disk, a magneto-optical disk, or a semiconductor memory.

In the computer 200 configured as described above, the CPU 201 loads a program that is stored, for example, in the storage unit 208 onto the RAM 203 via the input/output interface 205 and the bus 204, and executes the program. Thus, the above-described series of processing is performed.

Programs to be executed by the computer 200 (the CPU 201) are provided being recorded in the removable medium 211 which is a packaged medium or the like. Also, programs may be provided via a wired or wireless transmission medium, such as a local area network, the Internet or digital satellite broadcasting.

It should be noted that the program executed by the computer 900 may be a program that is processed in time series according to the sequence described in this specification or a program that is processed in parallel or at necessary timing such as upon calling.

An embodiment of the technology is not limited to the embodiments described above, and various changes and modifications may be made without departing from the scope of the technology.

For example, the imaging apparatus 10 can adopt a configuration that combines the above-mentioned embodiment and all or a par of its modified examples, and a constitution and operation that change the above-mentioned embodiment or its modified examples, or, replace all or a part of them by an operation mode or a setting signal.

Further, each step described by the above-mentioned flow charts can be executed by one apparatus or by allocating a plurality of apparatuses.

In addition, in the case where a plurality of processes are included in one step, the plurality of processes included in this one step can be executed by one apparatus or by sharing a plurality of apparatuses.

For example, the present disclosure can adopt a configuration of cloud computing which processes by allocating and connecting one function by a plurality of apparatuses through a network.

Note that effects described in the present specification are merely examples, and the effects are not limited to the effects described in the present specification. There may be effects other than those described in the present specification.

Additionally, the present technology may also be configured as below.

(1)

An imaging device, including:

a pixel array in which a plurality of pixels is arranged, the pixel including at least a photoelectric conversion section that converts incident light into charge by photoelectric conversion and a charge accumulating section that accumulates charge transferred from the photoelectric conversion section, in which at least some of pixels in the pixel array perform an operation to transfer charge generated by the photoelectric conversion section to the charge accumulating section at different timings between adjacent pixels.

(2)

The imaging device according to (1), in which the operation to transfer charge generated by the photoelectric conversion section to the charge accumulating section is executed repeatedly by a plurality of times within one frame period at a timing corresponding to a light emission pattern of a prescribed light source.

(3)

The imaging device according to (2), in which the light emission pattern of the prescribed light source is repetition of ON and OFF of light emission.

(4)

The imaging device according to (2) or (3), in which the prescribed light source is infrared light.

(5)

The imaging device according to any of (2) to (4), in which a length of an ON period of the light emission is different from a length of an OFF period.

(6)

The imaging device according to any of (1) to (5), in which a filter arrangement of the pixel array is a RGBW filter in which W, R, G, and B filters are arranged in a prescribed arrangement.

(7)

The imaging device according to (6), in which the pixel in which the W filter is arranged and the pixel in which the R, G, or B filter is arranged perform the operation to transfer charge generated by the photoelectric conversion section to the charge accumulating section at different timings.

(8)

The imaging device according to (6) or (7), in which all the pixels in which the W filters are arranged perform the operation to transfer charge at light emission timings of infrared light, and all the pixels in which the R, G, or B filters are arranged perform the operation to transfer charge at no light emission timings of infrared light.

(9)

The imaging device according to (6) or (7), in which some of the pixels in which the W filters are arranged perform the operation to transfer charge at light emission timings of infrared light, and the other of the pixels in which the W filters are arranged and all the pixels in which the R, G, or B filters are arranged perform the operation to transfer charge at no light emission timings of infrared light.

(10)

The imaging device according to any of (1) to (5), in which a filter arrangement of the pixel array is a Bayer arrangement, one G pixel of four pixels performs the operation to transfer charge at a light emission timing of infrared light, and another G pixel performs the operation to transfer charge at a no light emission timing of infrared light, the four pixels including two pixels×two pixels and serving as a repetition unit.

(11)

The imaging device according to any of (1) to (10), in which in the pixel array, there exist at least a first pixel that performs a charge transfer operation at a first timing during one frame period and a second pixel that performs a charge transfer operation at a second timing during the one frame period, and each of the first pixel and the second pixel switches the first timing and the second timing for performing the charge transfer operation to another timing in frame unit of the one frame period or more.

(12)

The imaging device according to any of (1) to (11), in which all pixels of the pixel array include a mode to perform the operation to transfer charge at a light emission timing of the prescribed light source and a mode to perform the operation to transfer charge at a no light emission timing of the prescribed light source.

(13)

The imaging device according to any of (1) to (12), in which, in addition to the photoelectric conversion section and the charge accumulating section, the pixel includes a discharge transistor that discharges charge generated by the photoelectric conversion section, and a transfer transistor that transfers charge generated by the photoelectric conversion section to the charge accumulating section, first and second transfer signal control lines to transmit a transfer signal to control the transfer transistor and first and second discharge signal control lines to transmit a discharge signal to control the discharge transistor are arranged on each row of the pixel array, and on each row of the pixel array, a pixel controlled by the first transfer signal control line and a pixel controlled by the second transfer signal control line are arranged alternately, and a pixel controlled by the first discharge signal control line and a pixel controlled by the second discharge signal control line are arranged alternately.

(14)

The imaging device according to any of (1) to (12), in which, in addition to the photoelectric conversion section and the charge accumulating section, the pixel includes a discharge transistor that discharges charge generated by the photoelectric conversion section, and a transfer transistor that transfers charge generated by the photoelectric conversion section to the charge accumulating section, a transfer signal control line to transmit a transfer signal to control the transfer transistor and a discharge signal control line to transmit a discharge signal to control the discharge transistor are arranged on each row of the pixel array, the transfer signal control line is connected to the transfer transistors of some of the pixels in two rows of the pixel array, and the discharge signal control line is connected to the discharge transistors of some of the pixels in two rows of the pixel array.

(15)

The imaging device according to any of (1) to (14), in which each pixel of the pixel array separates a charge transfer period to perform an operation to transfer charge generated by the photoelectric conversion section to the charge accumulating section and a read-out period to read out charge accumulated in the charge accumulating section, and all pixels simultaneously perform the charge transfer period.

(16)

The imaging device according to any of (1) to (14), in which each pixel of the pixel array executes an operation to transfer charge generated by the photoelectric conversion section to the charge accumulating section and an operation to read out charge in accumulated the charge accumulating section at a different timing by a predetermined time for each row.

(17)

A method for driving an imaging device, the method including:

performing an operation to transfer charge generated by a photoelectric conversion section to a charge accumulating section by at least some of pixels at different timings between adjacent pixels in a pixel array in which a plurality of pixels is arranged, the pixel including at least the photoelectric conversion section that converts incident light into charge by photoelectric conversion and the charge accumulating section that accumulates charge transferred from the photoelectric conversion section.

(18)

An imaging apparatus, including:

an imaging device including a pixel array in which a plurality of pixels is arranged, the pixel including at least a photoelectric conversion section that converts incident light into charge by photoelectric conversion and a charge accumulating section that accumulates charge transferred from the photoelectric conversion section, in which at least some of pixels in the pixel array perform an operation to transfer charge generated by the photoelectric conversion section to the charge accumulating section at different timings between adjacent pixels; and an image signal processing section that creates a first image from a first pixel signal acquired at a first timing in the imaging device, and creates a second image from a second pixel signal acquired at a second timing.

(19)

The imaging apparatus according to (18), in which at least some of pixels adjacent in a row direction in the pixel array of the imaging device perform the operation to transfer charge at different timings corresponding to ON and OFF of light emission of infrared light, and the image signal processing section creates a synthesized image by synthesizing luminance information of the first image acquired at the first timing of radiating infrared light and color difference information of the second image acquired at the second timing of radiating no infrared light, and outputs the synthesized image.

(20)

The imaging apparatus according to (18), in which at least some of pixels adjacent in a row direction in the pixel array of the imaging device perform the operation to transfer charge at different timings corresponding to ON and OFF of light emission of infrared light, and the image signal processing section creates the first image acquired at the first timing of radiating infrared light and the second image acquired at the second timing of radiating no infrared light, and outputs the first image and the second image.

REFERENCE SIGNS LIST

10 imaging apparatus, 13 CMOS image sensor, 14 Camera DSP section, 17 IR irradiating section, 21 Pixel array, 26 Vertical drive circuit, 31 Pixel, 41 Photodiode, 42 First transfer transistor, 43 Memory section, 44 Second transfer transistor, 45 FD, 46 Reset transistor, 47 Amplifier transistor, 48 Selection transistors, 49 Discharge transistor, 51 TRX control line, 52 OFG control line, 63 3DNR section, 64 High frequency interpolating section, 66 Demosaic section, 70 Luminance synthesizing section, 72 RGB converting section, 101 IR difference calculating section, 200 Computer, 201 CPU, 202 ROM, 203 RAM, 206 Input unit, 207 Output unit, 208 Storage unit, 209 Communication unit, 210 Drive

The invention claimed is:

1. An imaging device, comprising:
a pixel array in which a plurality of pixels is arranged, each pixel of the plurality of pixels including at least:
a photoelectric conversion section that converts incident light into charge by photoelectric conversion and a charge accumulating section that accumulates charge transferred from the photoelectric conversion section, wherein at least some of pixels in the pixel array perform an operation to transfer charge generated by the photoelectric conversion section to the charge accumulating section at different timings between adjacent pixels, wherein a filter arrangement of the pixel array is a RGBW filter in which discrete W, R, G, and B filters are arranged in a prescribed arrangement such that an array of four pixels by four pixels includes more discrete W filters than discrete G filters and includes more discrete G filters than discrete B filters, wherein all the pixels in which the discrete W filters are arranged perform the operation to transfer charge at light emission timings of infrared light, and wherein all the pixels in which the discrete R, G, or B filters are arranged perform the operation to transfer charge at no light emission timings of infrared light, wherein in the pixel array, there exist at least a first pixel that performs a charge transfer operation at a first timing during one frame period and a second pixel that performs a charge transfer operation at a second timing during the one frame period, and each of the first pixel and the second pixel switches the first timing and the second timing for performing the charge transfer operation to another timing in frame unit of the one frame period or more.

2. The imaging device according to claim 1, wherein the operation to transfer charge generated by the photoelectric conversion section to the charge accumulating section is executed repeatedly by a plurality of times within one frame period at a timing corresponding to a light emission pattern of a prescribed light source.

3. The imaging device according to claim 2, wherein the light emission pattern of the prescribed light source is repetition of ON and OFF of light emission.

4. The imaging device according to claim 2, wherein the prescribed light source is infrared light.

5. The imaging device according to claim 3, wherein a length of an ON period of the light emission is different from a length of an OFF period.

6. The imaging device according to claim 1, wherein the pixel in which the W filter is arranged and the pixel in which the R, G, or B filter is arranged perform the operation to transfer charge generated by the photoelectric conversion section to the charge accumulating section at different timings.

7. The imaging device according to claim 2, wherein all pixels of the pixel array include a mode to perform the operation to transfer charge at a light emission timing of the prescribed light source and a mode to perform the operation to transfer charge at a no light emission timing of the prescribed light source.

8. The imaging device according to claim 1, wherein, in addition to the photoelectric conversion section and the charge accumulating section, the pixel includes
a discharge transistor that discharges charge generated by the photoelectric conversion section, and
a transfer transistor that transfers charge generated by the photoelectric conversion section to the charge accumulating section,
first and second transfer signal control lines to transmit a transfer signal to control the transfer transistor and first and second discharge signal control lines to transmit a discharge signal to control the discharge transistor are arranged on each row of the pixel array, and on each row of the pixel array, a pixel controlled by the first transfer signal control line and a pixel controlled by the second transfer signal control line are arranged alternately, and a pixel controlled by the first discharge signal control line and a pixel controlled by the second discharge signal control line are arranged alternately.

9. The imaging device according to claim 1, wherein, in addition to the photoelectric conversion section and the charge accumulating section, the pixel includes
a discharge transistor that discharges charge generated by the photoelectric conversion section, and
a transfer transistor that transfers charge generated by the photoelectric conversion section to the charge accumulating section,
a transfer signal control line to transmit a transfer signal to control the transfer transistor and a discharge signal control line to transmit a discharge signal to control the discharge transistor are arranged on each row of the pixel array,
the transfer signal control line is connected to the transfer transistors of some of the pixels in two rows of the pixel array, and the discharge signal control line is connected to the discharge transistors of some of the pixels in two rows of the pixel array.

10. The imaging device according to claim 1, wherein each pixel of the pixel array separates a charge transfer period to perform an operation to transfer charge generated by the photoelectric conversion section to the charge accumulating section and a read-out period to read out charge accumulated in the charge accumulating section, and all pixels simultaneously perform the charge transfer period.

11. The imaging device according to claim 1, wherein each pixel of the pixel array executes an operation to transfer charge generated by the photoelectric conversion section to the charge accumulating section and an operation to read out charge in accumulated the charge accumulating section at a different timing by a predetermined time for each row.

12. A method for driving an imaging device, the method comprising:
performing an operation to transfer charge generated by a photoelectric conversion section to a charge accumulating section by at least some of pixels at different timings between adjacent pixels in a pixel array in which a plurality of pixels is arranged, each pixel of the plurality of pixels including at least:
the photoelectric conversion section that converts incident light into charge by photoelectric conversion and
the charge accumulating section that accumulates charge transferred from the photoelectric conversion section,
wherein a filter arrangement of the pixel array is a RGBW filter in which discrete W, R, G, and B filters are arranged in a prescribed arrangement such that an array of four pixels by four pixels includes more discrete W filters than discrete G filters and includes more discrete G filters than discrete B filters,
wherein all the pixels in which the discrete W filters are arranged perform the operation to transfer charge at light emission timings of infrared light, and
wherein all the pixels in which the discrete R, G, or B filters are arranged perform the operation to transfer charge at no light emission timings of infrared light,
wherein in the pixel array, there exist at least a first pixel that performs a charge transfer operation at a first timing during one frame period and a second pixel that performs a charge transfer operation at a second timing during the one frame period, and each of the first pixel and the second pixel switches the first timing and the second timing for performing the charge transfer operation to another timing in frame unit of the one frame period or more.

13. An imaging apparatus, comprising:
an imaging device including a pixel array in which a plurality of pixels is arranged, each pixel of the plurality of pixels including at least:
a photoelectric conversion section that converts incident light into charge by photoelectric conversion and
a charge accumulating section that accumulates charge transferred from the photoelectric conversion section, in which at least some of pixels in the pixel array perform an operation to transfer charge generated by the photoelectric conversion section to the charge accumulating section at different timings between adjacent pixels,
wherein a filter arrangement of the pixel array is a RGBW filter in which discrete W, R, G, and B filters are arranged in a prescribed arrangement such that an array of four pixels by four pixels includes more discrete W filters than discrete G filters and includes more discrete G filters than discrete B filters,
wherein all the pixels in which the discrete W filters are arranged perform the operation to transfer charge at light emission timings of infrared light, and
wherein all the pixels in which the discrete R, G, or B filters are arranged perform the operation to transfer charge at no light emission timings of infrared light; and
an image signal processing section that creates a first image from a first pixel signal acquired at a first timing in the imaging device, and creates a second image from a second pixel signal acquired at a second timing,
wherein in the pixel array, there exist at least a first pixel that performs a charge transfer operation at a first timing during one frame period and a second pixel that performs a charge transfer operation at a second timing during the one frame period, and each of the first pixel and the second pixel switches the first timing and the second timing for performing the charge transfer operation to another timing in frame unit of the one frame period or more.

14. The imaging apparatus according to claim 13, wherein at least some of pixels adjacent in a row direction in the pixel array of the imaging device perform the operation to transfer charge at different timings corresponding to ON and OFF of light emission of infrared light, and
the image signal processing section creates a synthesized image by synthesizing luminance information of the first image acquired at the first timing of radiating infrared light and color difference information of the second image acquired at the second timing of radiating no infrared light, and outputs the synthesized image.

15. The imaging apparatus according to claim 13, wherein at least some of pixels adjacent in a row direction in the pixel array of the imaging device perform the operation to transfer charge at different timings corresponding to ON and OFF of light emission of infrared light, and
the image signal processing section creates the first image acquired at the first timing of radiating infrared light and the second image acquired at the second timing of radiating no infrared light, and outputs the first image and the second image.

* * * * *